(12) United States Patent
Allen

(10) Patent No.: US 7,315,443 B2
(45) Date of Patent: Jan. 1, 2008

(54) NOTEBOOK COMPUTER LOCKING BASE

(76) Inventor: Peter Allen, 15 Berry Hill Rd., Oyster Bay Cove, NY (US) 11771

( * ) Notice: Subject to any disclaimer, the term of this patent is extended or adjusted under 35 U.S.C. 154(b) by 384 days.

(21) Appl. No.: 11/038,591

(22) Filed: Jan. 19, 2005

(65) Prior Publication Data

US 2005/0248914 A1 Nov. 10, 2005

Related U.S. Application Data

(60) Provisional application No. 60/626,839, filed on Nov. 10, 2004, provisional application No. 60/569,561, filed on May 10, 2004.

(51) Int. Cl.
*H05K 5/00* (2006.01)
*H05K 7/00* (2006.01)
*H01L 23/34* (2006.01)
*A47B 97/00* (2006.01)
*E05B 73/00* (2006.01)

(52) U.S. Cl. .................. 361/683; 257/727; 312/223.2; 211/8; 211/9

(58) Field of Classification Search .................. 211/8, 211/9, 26.2; 257/727, 731; 361/683; 312/223.2
See application file for complete search history.

(56) References Cited

U.S. PATENT DOCUMENTS

| | | | |
|---|---|---|---|
| 3,275,160 A | 9/1966 | Zurker | |
| 3,410,122 A | 11/1968 | Moses | |
| 3,410,580 A | 11/1968 | Longenecker | |
| 3,535,898 A | 10/1970 | Allport | |
| RE28,187 E | 10/1974 | Longenecker | |
| 3,965,705 A | 6/1976 | Nadler | |
| 4,066,231 A | 1/1978 | Bahner et al. | |
| 4,696,449 A * | 9/1987 | Woo et al. | 248/553 |
| 4,733,840 A * | 3/1988 | D'Amore | 248/205.3 |
| 4,870,842 A | 10/1989 | Plumer | |
| 5,052,198 A | 10/1991 | Watts | |
| 5,052,199 A | 10/1991 | Derman | |
| 5,076,079 A | 12/1991 | Monoson et al. | |
| 5,135,197 A | 8/1992 | Kelley et al. | |
| 5,169,114 A | 12/1992 | O'Neill | |
| 5,351,507 A | 10/1994 | Derman | |

(Continued)

FOREIGN PATENT DOCUMENTS

JP 2002149264 A 5/2002

(Continued)

*Primary Examiner*—Lisa Lea-Edmonds
*Assistant Examiner*—Anthony M. Haughton
(74) *Attorney, Agent, or Firm*—Alfred M. Walker

(57) ABSTRACT

A notebook/laptop computer locking assembly includes a locking base secured to a working surface. The locking base has a first rear wall to receive a keyboard portion of the notebook computer, with a screen portion of the notebook computer in the open position resting against the rear wall. A locking bar is adapted to pivot over the notebook computer screen in the open position, extending across a front surface of the screen portion. This locking bar has a rearwardly extending locking plug insertable within a locking receptacle of a lock. The locking bar is deployed on the notebook computer, thereby preventing removal of the notebook computer from the locking base. Additionally, locking holes are aligned with each other to receive a padlock to lock the locking bar to the locking base.

28 Claims, 18 Drawing Sheets

U.S. PATENT DOCUMENTS

| | | | |
|---|---|---|---|
| 5,469,726 A | 11/1995 | Rushing et al. | |
| 5,502,989 A | 4/1996 | Murray, Jr. et al. | |
| 5,531,082 A | 7/1996 | Wolk et al. | |
| 5,542,723 A | 8/1996 | Scharf | |
| 5,568,359 A | 10/1996 | Cavello et al. | 361/686 |
| 5,582,044 A | 12/1996 | Bolich | |
| 5,595,074 A * | 1/1997 | Munro | 70/58 |
| 5,645,261 A | 7/1997 | Glynn | |
| 5,709,110 A | 1/1998 | Greenfield et al. | |
| 5,787,739 A | 8/1998 | Derman | |
| 5,794,463 A | 8/1998 | McDaid | |
| 5,816,076 A | 10/1998 | Biedermann et al. | |
| 5,836,183 A * | 11/1998 | Derman | 70/58 |
| 5,927,108 A | 7/1999 | Pierce | |
| 6,000,252 A | 12/1999 | Murray, Jr. et al. | |
| 6,006,557 A | 12/1999 | Carl et al. | |
| 6,138,483 A | 10/2000 | Galant | |
| 6,155,088 A | 12/2000 | Murray, Jr. et al. | |
| 6,185,964 B1 | 2/2001 | Addiego | |
| 6,212,921 B1 | 4/2001 | Knighton | |
| 6,216,499 B1 | 4/2001 | Ronberg et al. | |
| 6,237,375 B1 | 5/2001 | Wymer | |
| 6,275,378 B1 | 8/2001 | Lee et al. | 361/686 |
| 6,308,928 B1 | 10/2001 | Galant | |
| 6,317,936 B1 | 11/2001 | McDaid et al. | |
| 6,331,934 B1 | 12/2001 | Helot et al. | 361/686 |
| 6,427,499 B1 | 8/2002 | Derman | 70/58 |
| 6,443,417 B2 | 9/2002 | Galant | |
| 6,477,870 B1 | 11/2002 | Derman | |
| 6,477,871 B1 | 11/2002 | Shaw | 70/58 |
| 6,578,394 B2 | 6/2003 | Yin | 70/58 |
| 6,581,420 B1 | 6/2003 | Ling et al. | |
| 6,590,767 B2 * | 7/2003 | Liao et al. | 361/686 |
| 6,612,455 B2 | 9/2003 | Byme | |
| 6,684,548 B1 | 2/2004 | Petrus | |
| 6,689,954 B2 | 2/2004 | Vaughan et al. | |
| 6,697,252 B2 | 2/2004 | Maeda | 361/686 |
| 6,705,133 B1 | 3/2004 | Avganim | |
| 6,711,921 B1 | 3/2004 | Yang | |
| 6,735,990 B1 | 5/2004 | Murray, Jr. et al. | |
| 6,755,056 B2 | 6/2004 | Igelmund | |
| 6,763,690 B2 * | 7/2004 | Galant | 70/58 |
| 6,796,536 B1 * | 9/2004 | Sevier, IV | 248/121 |
| 6,810,698 B2 | 11/2004 | Weinraub | |
| 6,820,362 B1 | 11/2004 | Petrus | |
| 6,865,914 B2 | 3/2005 | Irgens | 70/231 |
| 6,913,238 B2 * | 7/2005 | Bakker et al. | 248/460 |
| 7,007,912 B1 * | 3/2006 | Giuliani et al. | 248/552 |
| 2005/0161557 A1* | 7/2005 | Heintz | 248/121 |
| 2006/0075794 A1 | 4/2006 | Ling et al. | 70/58 |

FOREIGN PATENT DOCUMENTS

JP      2004318426 A      11/2004

* cited by examiner

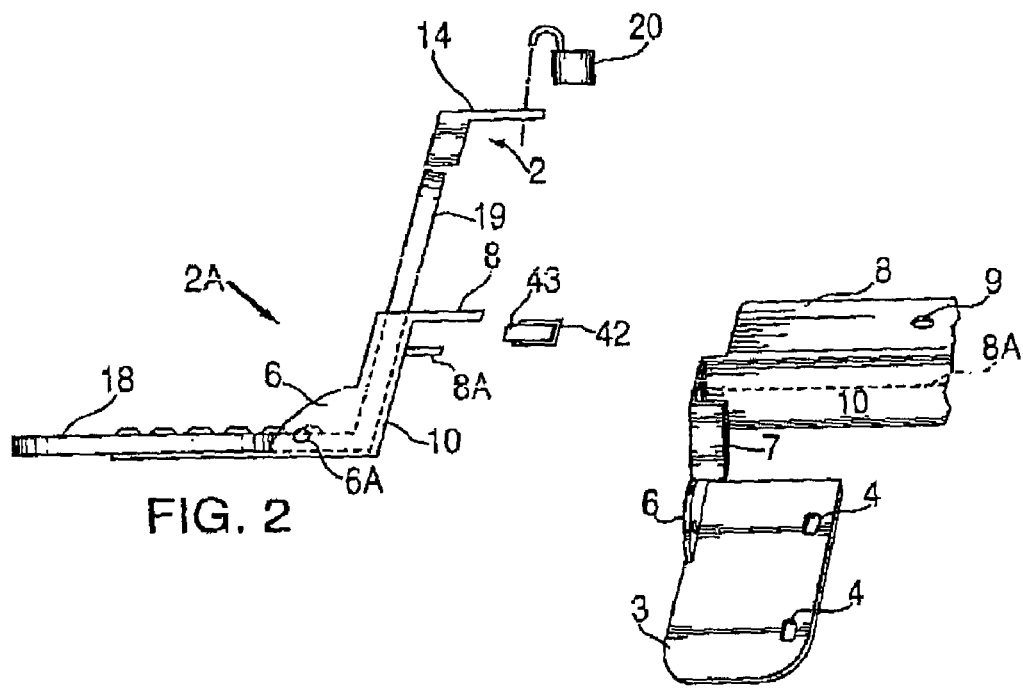
FIG. 2
FIG. 2A
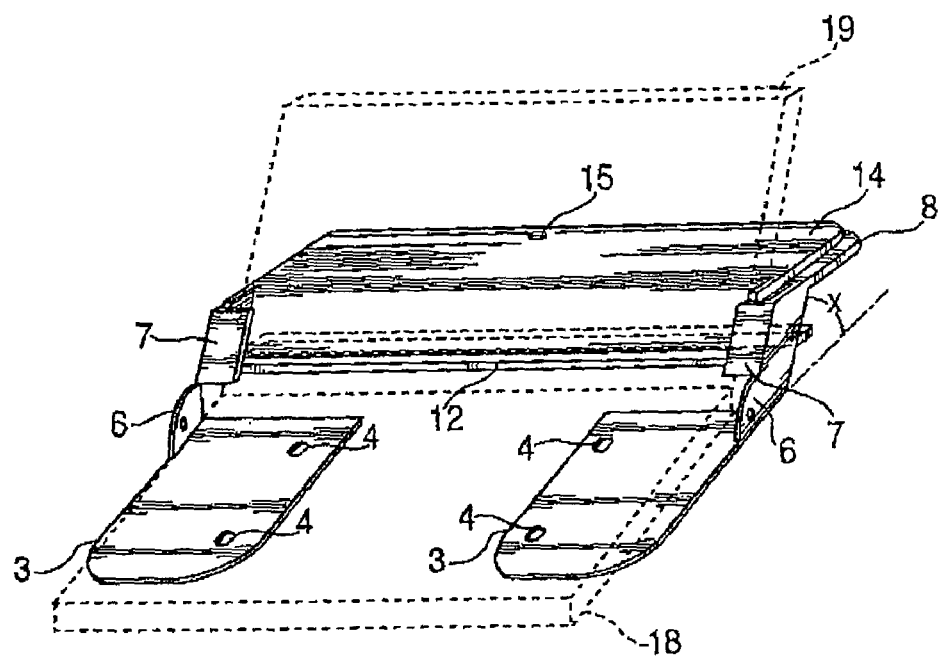
FIG. 2B

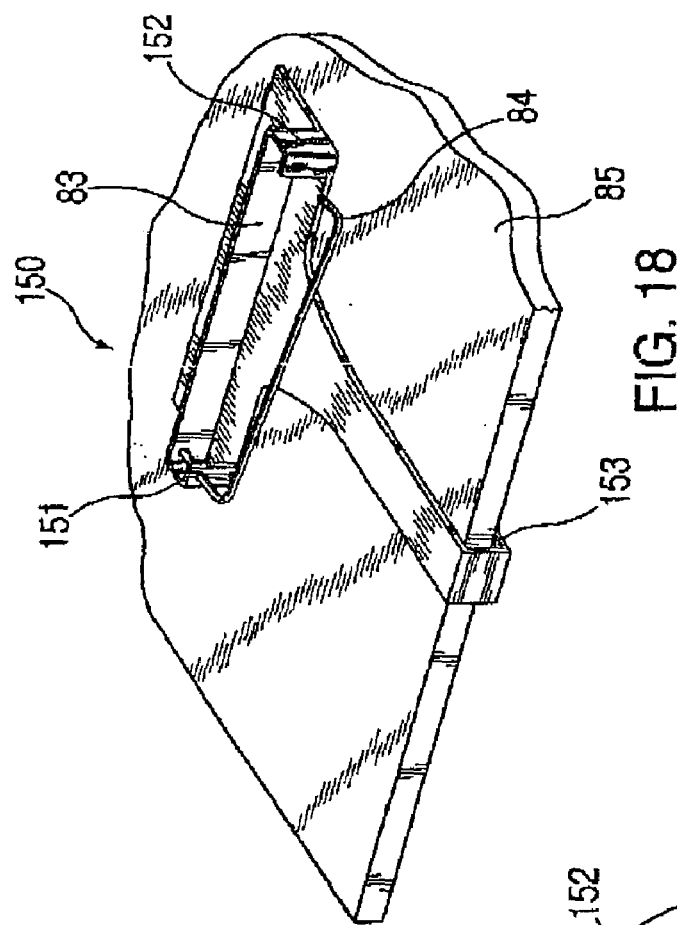
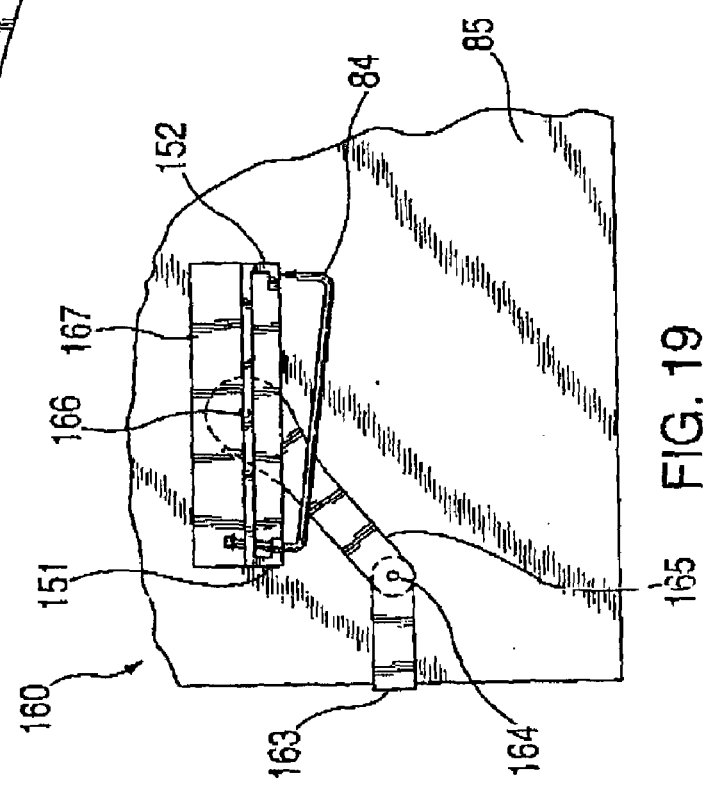

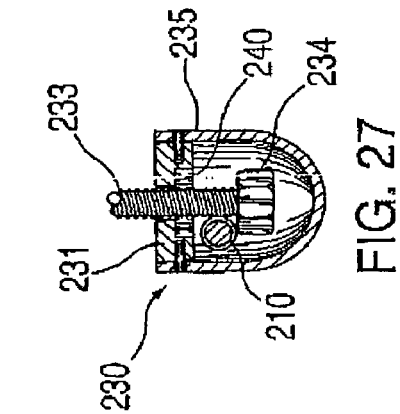
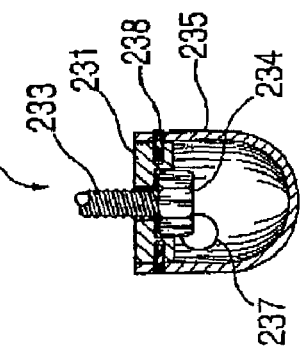
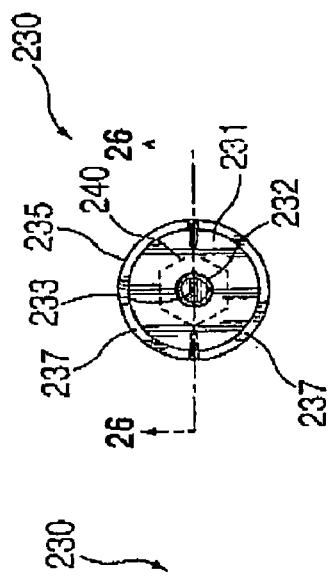
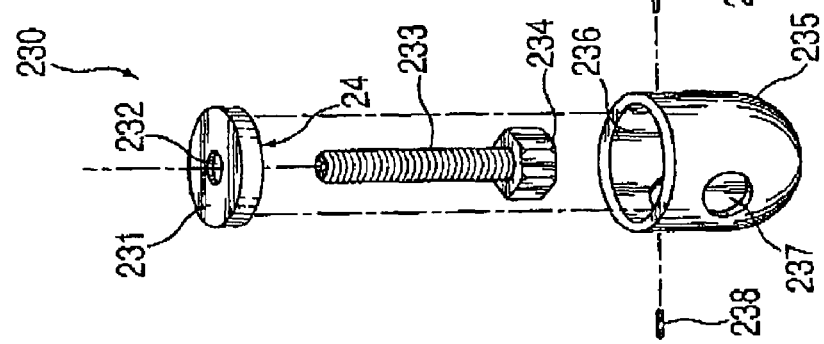
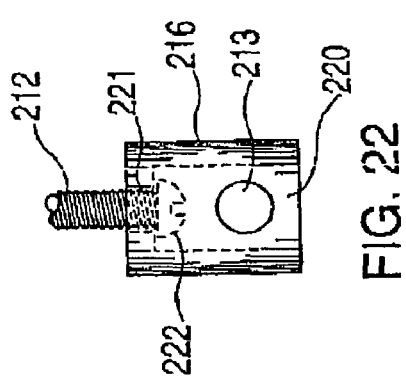
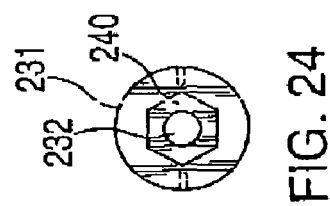

US 7,315,443 B2

NOTEBOOK COMPUTER LOCKING BASE

RELATED APPLICATIONS

This application is based in part upon provisional patent application Ser. No. 60/626,839 filed Nov. 10, 2004 and upon provisional patent application Ser. No. 60/569,561 filed May 10, 2004 and claims benefit under 35 U.S.C. 119(e) therefrom.

FIELD OF THE INVENTION

The present invention relates to security locks for laptop and/or notebook computers and other hand-held electronic devices, such as cell phones, personal digital assistants and the like.

BACKGROUND OF THE INVENTION

Notebook computers are increasingly used by students at educational institutions. They are also used by workers at job sites. Notebook computers are often referred to as laptop computers, meaning a portable, foldable computer which can be used while positioned upon the user's lap. In some instances, "laptop computer" refers to the term used in the trade for an older version of a larger portable computer. However, with increasing streamlining and downsizing of portable computers, compact, smaller versions are referred to as "notebook computers", but the terms are generally interchangeable.

In order to safeguard the notebook computer, it must be shut down, closed and transported by the user.

However, it is often advantageous for the user of a notebook computer to take a break and leave the computer open and operable at a work station or library study carrel, with other papers and books left at their current open position. This leaves the notebook computer vulnerable to theft.

Moreover, in the commercial retail environment, it is advantageous to display consumer electronic devices, such as notebook computers, cell phones or personal digital assistants in a secure but visually accessible display.

OBJECTS OF THE INVENTION

It is therefore an object of the present invention to provide a security lock for a notebook computer in an open position.

It is also an object of the present invention to provide a commercial retail display which allows visual access to notebook computers, cell phones and personal digital assistants while safeguarding these devices from shoplifting theft.

Other objects which become apparent from the following description of the present invention.

SUMMARY OF THE INVENTION

In keeping with these objects and others which may become apparent, the present invention is a desk surface locking base which holds a notebook and/or laptop computer in a secure but open position. When locked in place, the notebook computer is secure from being taken away from the surface to which it is locked. Furthermore, taking advantage of software and/or software/biometric security systems, the computer will also be unusable by unauthorized individuals when its owner is away from the area for a break, telephone call, or other short-term pursuits. With a few keystrokes, the owner of the computer can resume activity in exactly the same place as when activity had been suspended. This is especially useful for leaving an active computer on a study desk or library carrel.

In one embodiment, the notebook computer lock includes a locking base having a receptacle for receiving a distal end of a pivotable locking member pivotably attached at a proximal end thereof to the locking base. The locking member locks the computer screen between it and the locking base. The locking base is fastenable to a notebook computer work surface, such as a desk top or other table surface, in the vicinity of the notebook computer. A pin lock secures the locking bar across the display screen portion of the notebook computer and into a hole in the locking base, thereby securing the notebook computer in a locked position within the components of the notebook computer lock.

In another embodiment, the locking base is screwed or otherwise fastened to the work surface in a permanent fashion. A locking collar is then removed from the base and then placed over the liquid crystal display (LCD) screen of the open notebook computer within the framework of the locking base. A lock, such as a padlock, is then used to lock together the locking collar and the locking base, thereby making it impossible to remove the notebook computer from the work surface.

In this embodiment, the notebook computer locking assembly includes a locking base for being secured to a working surface, wherein the locking base has a rear wall to receive a keyboard portion of the notebook computer with a screen portion of the notebook computer in the open position resting parallel to the rear wall. The rear wall has a rearwardly extending locking flange along a top edge of the rear wall. A locking frame includes a second rear wall having side walls and a locking bar joining the side walls, wherein the locking frame is adapted to slide over the screen portion of the notebook computer in the open position, with the second rear wall between the screen portion and the first rear wall and the locking bar extends across a front surface of the screen portion.

This second rear wall has a rearwardly extending locking flange along a top edge of the second rear wall on top of, and flush against, the locking flange of the first rear wall. The side walls of the locking base have tabs bent toward the computer, with the locking bar falling behind the bent tabs, when the locking frame is deployed on the notebook computer, thereby preventing removal of the notebook computer from the locking base. Additionally, locking holes in both flanges are aligned with each other to receive a padlock to lock the locking frame to the locking base.

Fasteners are employed to attach the locking base to the working surface, so that the fasteners are kept under the keyboard portion of the computer.

The lower edges of the rear walls are raised a sufficient distance to allow access to connectors on a rear surface of the keyboard portion of the computer.

Preferably, an optional cage is attached to a rear of the first rear wall to house an auxiliary battery, charger or battery eliminator.

In an alternate embodiment, an elongated framework of the locking base is used that supports the LCD screen of the notebook computer at the proper viewing angle, just as in the preferred embodiment. In this case, however, the locking device is a transparent screen cover, such as of LEXAN® polycarbonate, which is placed over the screen and then locked to the locking base with a lock, such as a padlock. This panel is also a screen protector. This is a desirable feature for a demo station at a retail outlet, to display and demonstrate a notebook computer or advertise another product. Using an auxiliary locking flange, this embodiment is also compatible with the locking collar of the preferred embodiment. This use mode does not obscure viewing of the LCD screen directly, when viewing the display screen through the transparent polycarbonate sheet. Similar smaller locking bases with polycarbonate or other strong locking panels can be used to display and demonstrate consumer devices, such as personal digital assistants (PDA's), scientific calculators, and cell phones, on store shelves.

This embodiment may also have an optional accessory cage made of heavy wire mesh or perforated metal, which can be attached to the back portion of the locking base. This securely contains a battery charger/eliminator for the notebook computer.

In this embodiment with a transparent screen cover, the notebook computer locking assembly includes a locking base secured to a working surface, with the locking base having a pair of side walls and a rear wall to receive a keyboard portion of the notebook computer, wherein a screen portion of the notebook computer is oriented in the open position, resting adjacent to the rear wall. This rear wall has a rearwardly extending locking flange along a top edge thereof.

The transparent locking frame has a surface adapted to rest adjacent to, or against, a front surface of the screen. A top wall is adapted to rest against a top surface of the screen portion of the computer, with a rear wall extending down from the top wall, adjacent to a rear surface of the screen portion of the notebook computer. A rearwardly extends flange from a bottom edge of the rear wall, with the rearwardly extending flange positioned adjacent to the rearwardly extending locking flange of the locking base.

In this embodiment, locking holes in both flanges are aligned with each other to receive a padlock, to lock the transparent locking frame to the locking base.

In this embodiment, an optional shelf or shelves may be provided to display handheld electronic accessories, such as cell phones, PDA's, calculators, video game controls, etc., for retail viewing purposes through the transparent screen cover.

In yet another embodiment, the pivoting locking rod, locking collar or transparent polycarbonate locking panel is replaced by a telescoping rod, a vinyl covered steel cable, or a flexible tubing covered chain. Like the pivoting rod version, this embodiment therefore eliminates the removable portion of the locking base system (such as the locking collar or transparent polycarbonate panel), and instead uses a locking device that is permanently attached to one side of the locking base itself. This locking device is also locked with a padlock by first passing the distal end of the locking member through a hole in the opposite side panel member of the locking base thereby preventing removal of the notebook computer.

In this embodiment, the notebook computer locking assembly includes a locking base secured to a working surface, with the locking base having a pair of side walls and a rear wall to receive a keyboard portion of the notebook computer. A screen portion of the notebook computer is held in the open position, resting against and/or parallel to the rear wall, with the side walls extending past a front surface of the screen portion. A telescoping locking bar or flexible locking cable is hinged at one end to one of the side walls, in front of the screen portion. An opposite end of this telescopic or flexible locking bar or cable has a plug with an opening therethrough. An opening in the other of the side walls is configured to align with the opening in the plug, when the locking bar is rotated across a front surface of the screen portion, with the plug positioned adjacent the other of the side walls to accommodate a padlock, to lock the notebook computer into the locking base.

In a further embodiment the computer lock is attached to a horizontal desk or work surface via a locking base which is separate from the computer lock itself. The computer lock is then slipped into the locking base from the side and both the computer and locking base are then secured to the work surface. In this manner, no holes are drilled into the work surface, and the locking base is removable yet secure. The locking base is secured to the work surface by a clamp which goes over the front edge and engages the bottom surface via a screw with a pointed end which is tightened so as to indent the underside and thereby attach. The screw itself can have a security head such as an alien socket with a concentric protruding rod which prevents the use of a simple allen wrench. A specialty security alien wrench with a hole to accommodate the protruding rod is required for the initial attachment as well as subsequent removal. A side bracket attached to the clamp also accommodates a mailbox type key lock which can be used to deny access to the attachment screw head for an extra measure of security. If the key lock is used, an ordinary non-security screw can be used since the lock tang itself will adequately secure the screw. The computer lock used with this embodiment has a horizontal frame member with two vertical side brackets at each end attached to base plates which can be screwed to a work surface as in the previous embodiments or used with the locking base.

A bar which is captively attached to one bracket secures the bottom of the notebook computer display when the other end is passed through a hole in the distal bracket and a key lock is then slipped over the bar end which has a groove compatible with the lock.

In another embodiment, the above noted computer lock is attached to directly to a horizontal desk or work surface by fasteners.

Yet another embodiment of a computer lock, the lock has a continuously width adjustable feature to accommodate computers with a variety of display width sizes. It includes a left portion with vertical bracket, base attachment plate, horizontal member, and captive lock bar. A right portion has a vertical bracket, base plate and hollow horizontal member sized to receive the left horizontal member in a telescoping fashion. The locking bar is fabricated of a left portion which is a threaded tubing member having coarse threads. The right portion of the locking bar is a solid member with mating external threads on its long end. This computer lock is used with the locking base of the previous embodiment to take advantage of its telescoping feature. (It can also be screwed down to a work surface directly, but the adjustable feature would be defeated unless screws are moved to other adjustment holes.)

To use the computer lock, the user places a notebook computer within the side brackets, and then pushes the sides in adjacent to the computer display. Then the user screws the distal end of the locking bar in or out to facilitate the end fitting through the lock holes on the right bracket. When locked with a key lock, the bar will secure the computer and prevent the spreading of the side brackets.

In a related embodiment, the width adjustable feature is discrete instead of continuous. Although any suitable width adjustment mechanism can be used, a suggested type uses a peg which fits into a hole in the larger of the two telescoping members. The inner telescoping member has a series of holes which define the width steps when in registration with the single hole of the larger/outer telescoping member. The peg locks the outer hole to one of the inner holes.

In another embodiment, the locking base described above is integrated with a computer lock in a single unit. Thus the computer lock is now directly attached to the work surface via a clamp that goes over an edge of a work table and locks into the bottom surface of the work table.

In yet a related embodiment, the integrated locking base/computer lock has two pivots from the clamp end to the computer lock so that much positional freedom is afforded the locked computer over the work surface. For example, this pivoting embodiment can be used on corners of work tables.

In a preferred embodiment for consumer use, a low profile locking base with a narrow footprint is used. Due to its smaller dimensions, less material is required. Since it can be stamped and formed from a single rectangular sheet with little waste, the process for manufacture is very efficient. Heavy gage aluminum sheet or stainless steel sheet can be used. It is therefore lighter and more economical.

In one application this locking base is permanently screwed down to the work surface, and the user would have his or her own pin lock, to secure the locking bar across the display portion and into the base back, thereby securing the notebook computer.

However, the preferred mode of use for this embodiment is to combine the locking base with a cable and clamp as a portable kit which fits into a convenient tubular carrying case. The clamp is attached to the work surface or to a table leg or any convenient non-movable structure in the vicinity.

This is accomplished by tightening a clamp screw against the object. The clamp screw extends from a clearance hole in a container, such as a short tube, with a large axial hole at the distal end that accommodates the screw head. An appropriate tool compatible with the type of screw head used is entered from the distal hole to tighten or loosen the clamp while also capturing the short tube; this can be an allen wrench, a screwdriver, or a hex head driver as appropriate.

The cable has a small end ferrule with a transverse hole on one end and a ferrule with a larger end attached to the distal end of the cable. A transverse hole in the lower portion of the short tube accepts the ferrule and cable, but is sized to prevent access to the larger end of the distal ferrule.

In use, the clamp is attached to the structure as described; then the cable is threaded through the transverse hole in the short tube. The end of locking bar is passed through the cable ferrule with the transverse hole prior to locking it to the locking base. In this manner, although the computer can be moved around on the work surface, it is secured by the cable.

It is noted that the cable being threaded through the transverse hole in the container, such as the short tube, denies access to the clamp screw head. The cable must be removed before the clamp can be loosened.

In an alternate embodiment of the clamp screw subassembly of this preferred embodiment, no tool is required to tighten or loosen the clamp. For example, a hollow knob with a captive locking member, such as a clamp screw, emerging from a clearance hole in an end cap, is used.

The clamp screw has a tall head and can be a hex, square or other geometric configuration. A recess with a configuration matching the screw head is formed into the inside surface of the end cap such that a slight pull on the knob against the captive screw head (i.e.—away from the clamp) will seat the head into the recess with a slight turn. Thus the end cap is a socket wrench used to either tighten or loosen the clamp.

A strategically placed offset transverse hole is prevented from accepting the cable by the screw head if the screw head is seated in the wrench recess.

By pushing up on the end of the knob (toward the clamp), clearance for the cable to enter through the transverse hole adjacent to the screw and between the head and end cap is formed. Thus, the screw head is spaced apart from the end cap socket wrench recess as long as the cable is present. If the knob is turned while the cable is installed, it will just turn freely with no ability to loosen the clamp even if force away from the clamp is used. The cable must be removed before the clamp can be loosened.

BRIEF DESCRIPTION OF THE DRAWINGS

The present invention can best be understood in connection with the accompanying drawings. It is noted that the invention is not limited to the precise embodiments shown in drawings, in which:

FIG. 2 is a side view of the embodiment of FIG. 1, taken along in the direction of arrow "2" of FIG. 1, showing a typical notebook computer locked with a locking base and locking collar to a work surface with a padlock;

FIG. 2A is a partial fragmentary view of the locking base as in FIG. 2, taken along in the direction of arrow "2A" of FIG. 2;

FIG. 2B is a partial perspective view of the typical notebook computer locked in place between the locking base and locking collar of FIG. 2;

FIG. 18 is a perspective view of an integrated locking base/computer lock embodiment;

FIG. 19 is a top plan view of another integrated locking base/computer lock with two pivot links;

FIG. 22 is a detail side view of the clamp screw subassembly used in FIG. 21;

FIG. 23 is an exploded perspective view of the components of an alternate embodiment with a socket wrench type clamp screw subassembly;

FIG. 24 is a bottom view of the end cap of the embodiment of FIG. 23, showing the recess which forms the socket wrench element;

FIG. 25 is a top view of the clamp screw assembly as in FIG. 23, shown with the captive screw;

FIG. 26 is a side view crossection of the clamp screw assembly as in FIG. 23, shown with the screw head seated in the socket wrench recess and preventing insertion of the cable; and, FIG. 27 is a side view in crossection of the clamp screw assembly as in FIG. 23, shown with the cable preventing seating of the screw head in the socket wrench recess.

DETAILED DESCRIPTION OF THE INVENTION

Figure 1:
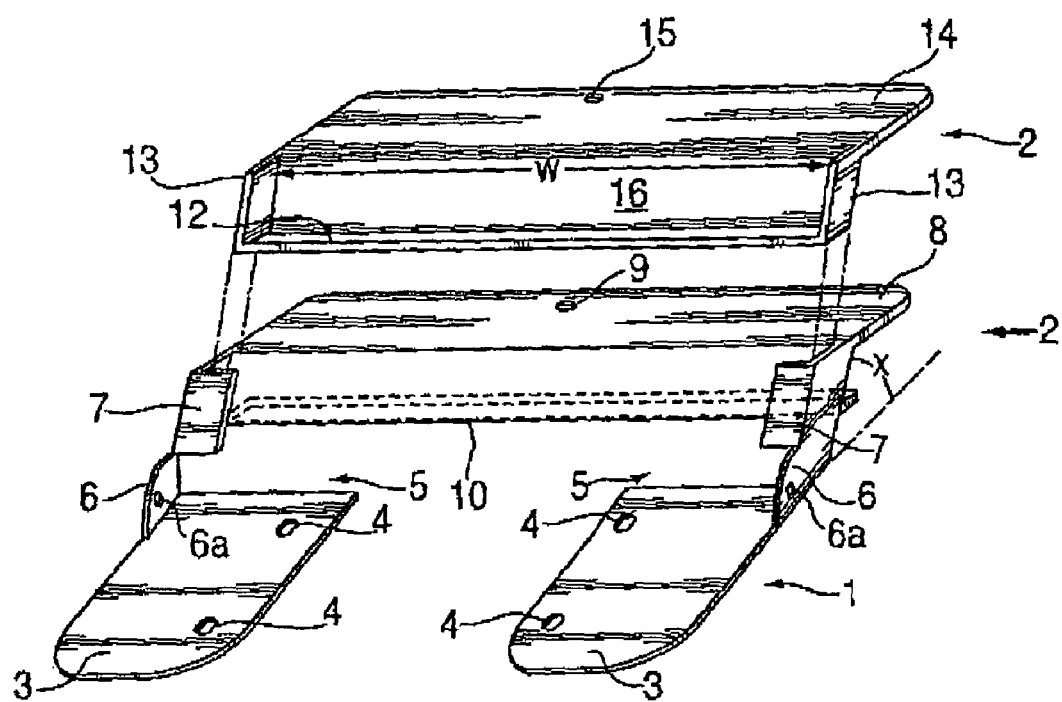
FIG. 1 is a perspective view of a locking base and locking collar of one of the embodiments for a notebook computer lock of this invention.

FIG. 1 shows locking base 1 for a notebook computer lock, which is secured to a working surface by fastener holes, such as screw through holes 4 in base mounting pads 3. A back surface 10 is tilted at angle "X" to provide a good viewing angle of the computer screen. Side panel members 6 with bent tabs 7 provide a space for sliding locking collar 2. Locking flange 8 with a locking hole, such as padlock hole 9, is used to secure locking collar 2 with flange 14 via hole 15, which is in positional registration with hole 9 when mated. Width "W" is wider than the widest notebook computer to be accommodated by this locking base system. Locking bar 12, attached to the distal ends of sides 13, actually secures the notebook computer. This is the preferred embodiment. In use, the keyboard portion of a notebook computer would deny access to the fasteners, such as retaining screws, in holes 4.

Side panel members 6 may have one or more ports 6a to accommodate computer cables therethrough.

Figure 2C:
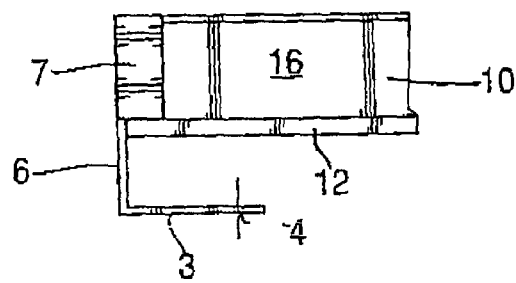
FIG. 2C is a partial front elevational view of the locking base and locking collar as in FIG. 2, taken along the direction of arrow "2C" of FIG. 2B.
Figure 2D:
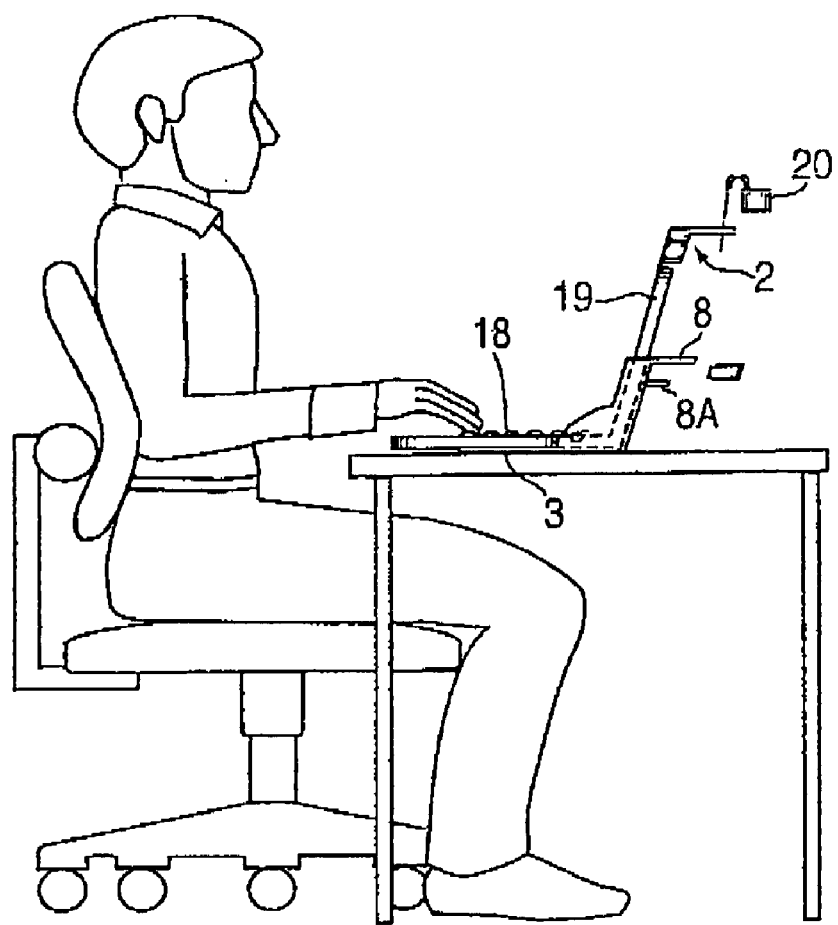
FIG. 2D is a side elevational view of the notebook computer shown used by a person at a work station.

FIG. 2 shows how locking collar 2 is placed over notebook computer screen 19 and then upon flange 14, and is locked to lower flange 8 via a lock, such as padlock 20. Keyboard 18 fits between sides 6. Space 5 is created by a raised back panel 10 so as to permit access to a variety of connectors at the back of computer keyboard portion 18. FIG. 2 also shows an optional compartment 42 for a power source accessory 43, such as an auxiliary battery charger or battery eliminator, wherein compartment 42 extends between power flange 8 and further lower flange 8A.

Figure 3:
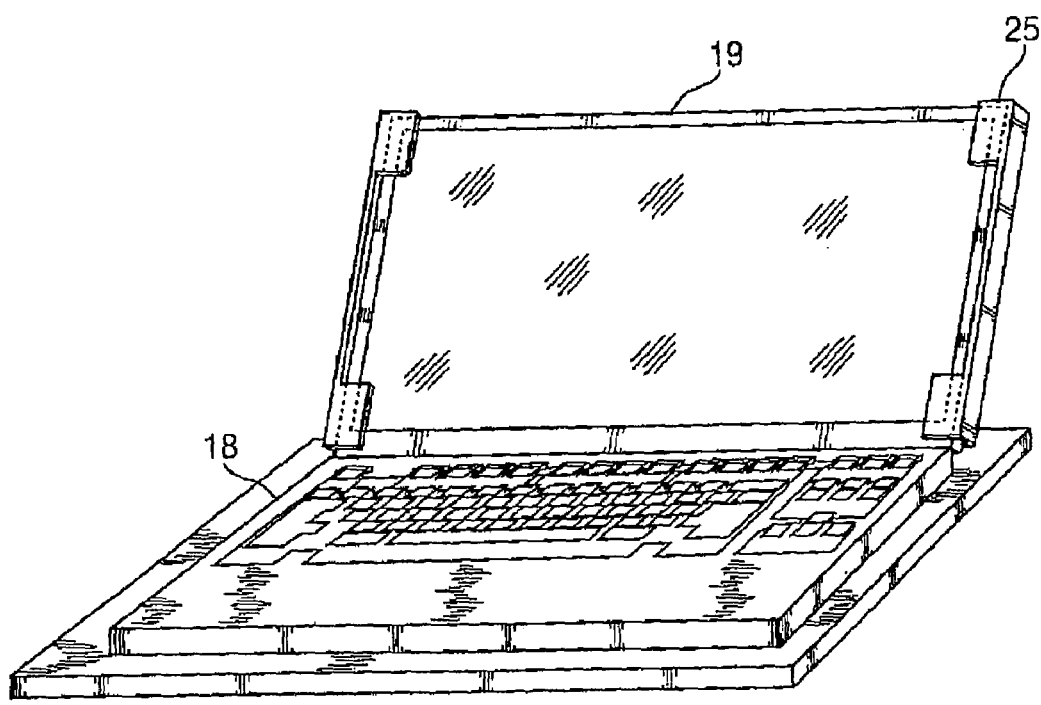
FIG. 3 is a perspective view of an alternate embodiment showing a typical notebook computer in the locking base with an elongated back side.
Figure 3B:
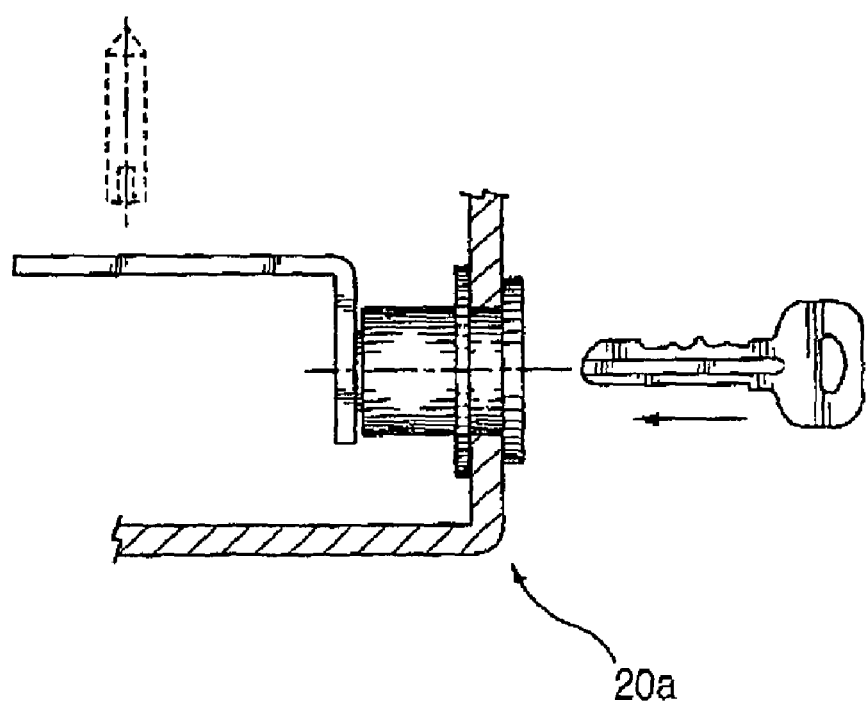
FIG. 3B is a close-up of one type of key lock used with the notebook computer lock of the present invention.
Figure 4:
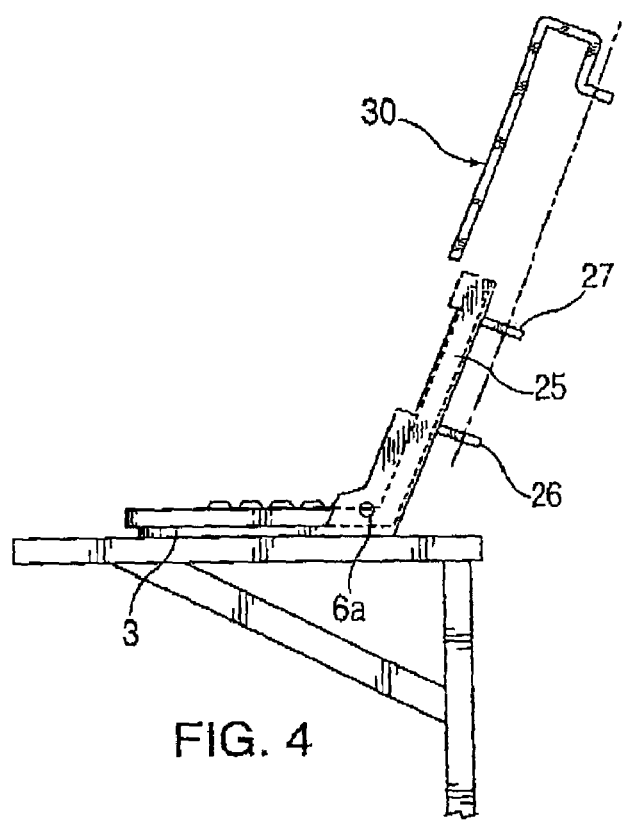
FIG. 4 is a side view of alternate embodiment for a notebook computer lock of FIG. 3, showing dual locking flanges.

In an alternate embodiment shown in FIG. 3, upright portion 25 supports the entire height of screen 19 above raised back panel 10 mounted upon base pads 3. This can also be shown in FIG. 4. FIG. 3B shows another example of a lock 20a, which can be used in lieu of padlock 20.

Figure 3A:
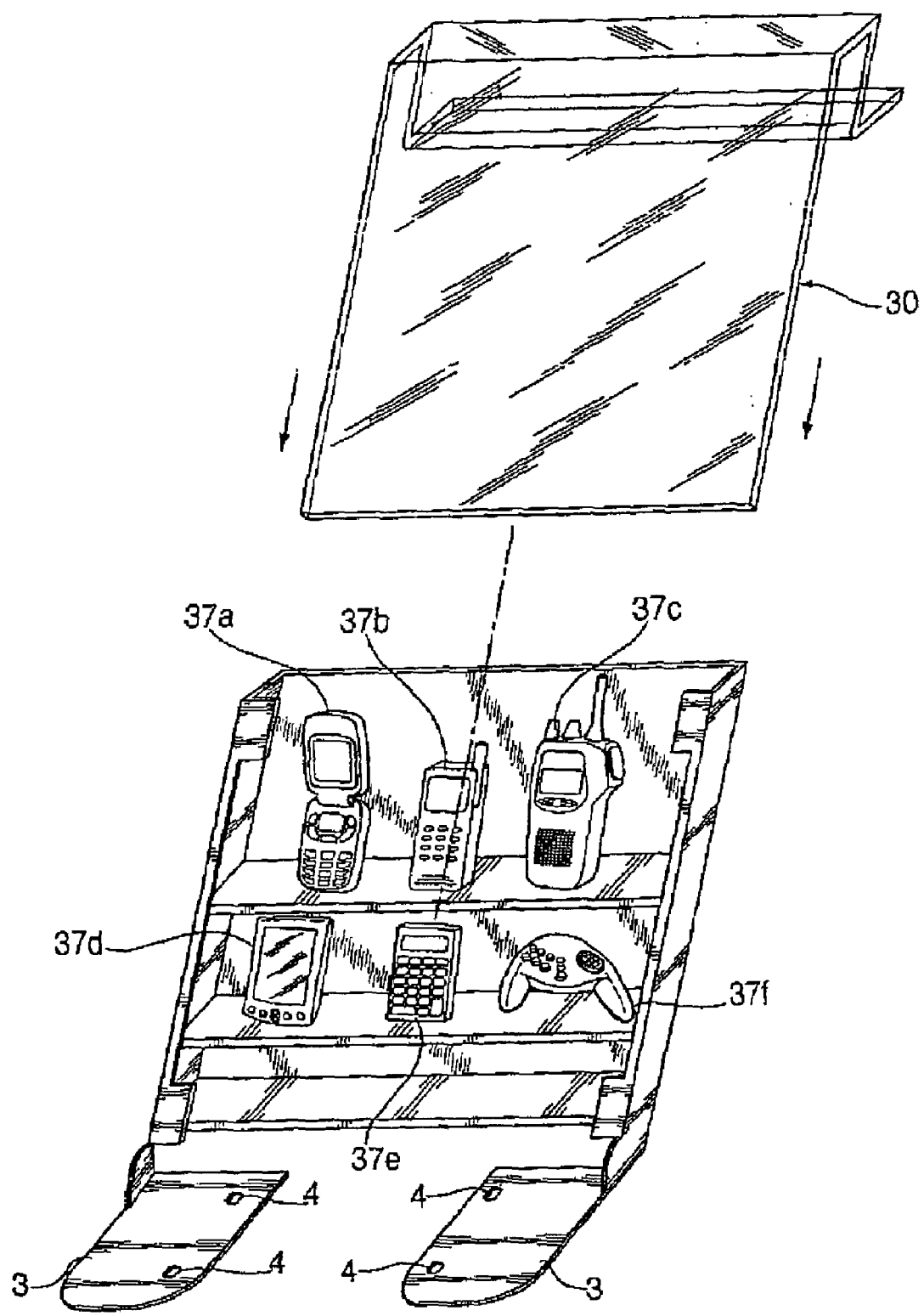
FIG. 3A is an exploded perspective view of a further embodiment, showing handheld electronic accessories displayed upon respective shelves, added to the front side of the locking base of FIG. 3.

FIG. 3A shows a further alternate embodiment where shelves 36 and 36a are depicted supporting electronic handheld devices such as folding cell phone 37a, upright cell phone 37b, marine VHF radio 37c, personal digital assistant 37d, calculator 37e and video game pad controller 37f.

Figure 5:
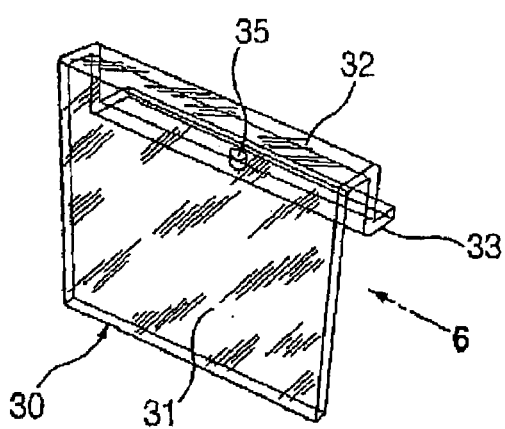
FIG. 5 is a perspective view of a transparent locking panel of the alternate embodiment shown in FIG. 4.

A transparent panel, such as LEXAN® polycarbonate panel 30, shown in FIG. 5, is used as a locking, by sliding it over screen 19 within the four tabs shown in FIG. 3 at the distal corners of upright 25.

Figure 6:
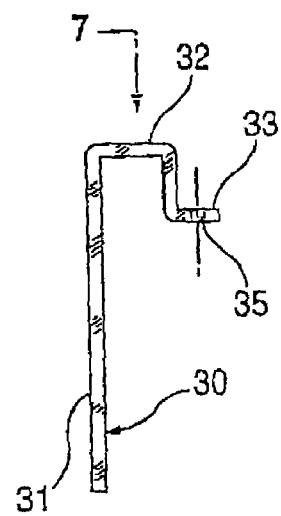
FIG. 6 is a side edge view of the transparent locking panel showing a locking flange, taken along in the direction of arrow "6" of FIG. 5.
Figure 7:
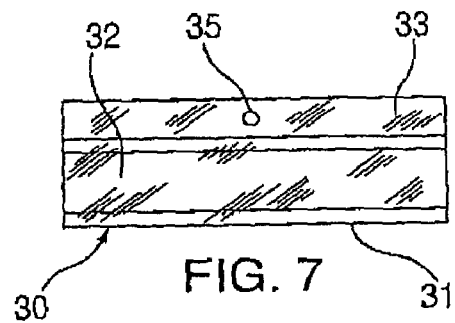
FIG. 7 is a top plan view of the transparent locking panel showing a padlock hole in the locking flange, taken along in the direction of arrow "7" of FIG. 6.

Panel 30, shown in FIGS. 5-7, has a top portion 32 and a locking flange 33 with padlock hole 35. In use, this hole is in positional registration with that of upper locking flange 27 shown in FIG. 4. A padlock 20 or other small lock 20a can be used to secure the two members together. Front face 31 of transparent panel 30 protects the surface of computer screen 19. This can be used to advantage in a retail demo environment. Alternately, the locking collar of FIG. 1 can be used with base of FIG. 3 by locking into lower locking tab 26; this would offer a better unencumbered view of screen 19.

Figure 8:
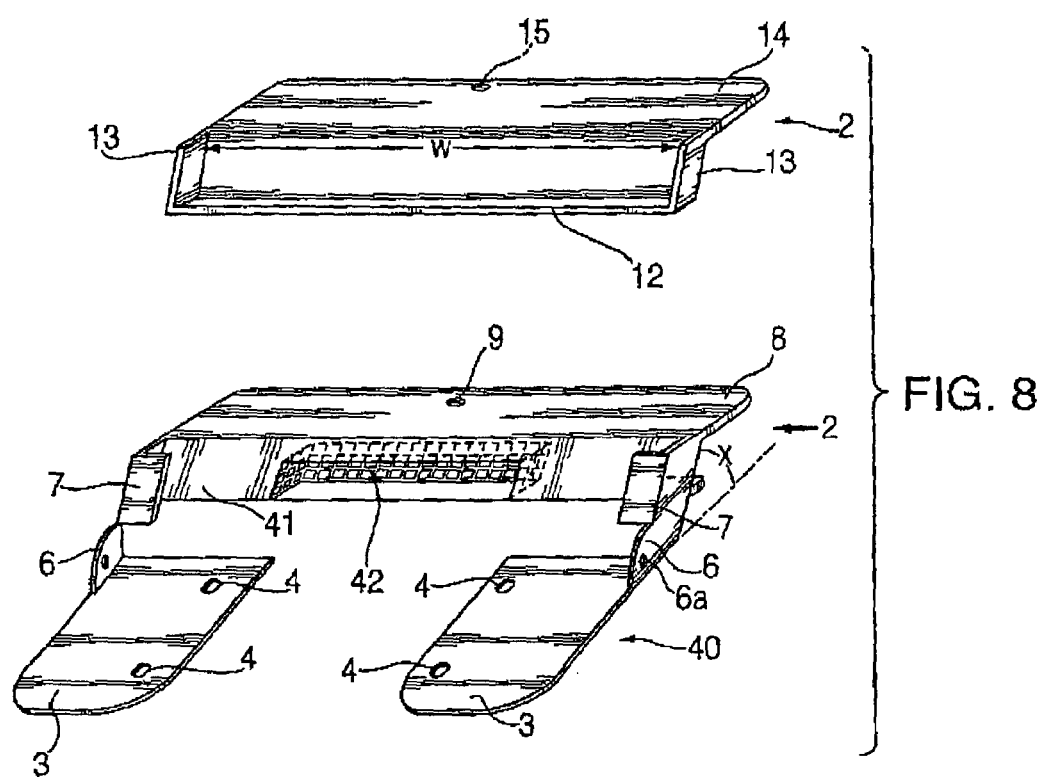
FIG. 8 is an exploded perspective view showing the addition of an optional battery pack housing cage feature to the locking apparatus of the embodiment shown in FIG. 1, although it can be used with any of the embodiments herein.

The optional power source component 42 of FIG. 2 feature can be added to any of the embodiments of this invention including that shown in FIGS. 3-27. It is preferably a cage made of heavy duty wire screen or perforated metal that is attached (as by welding or rivets) to a rear panel, such as panel 41 in FIG. 8. This provides a secure compartment 42 for a power source accessory 43, such as an auxiliary battery, charger, or battery eliminator.

Figure 9:
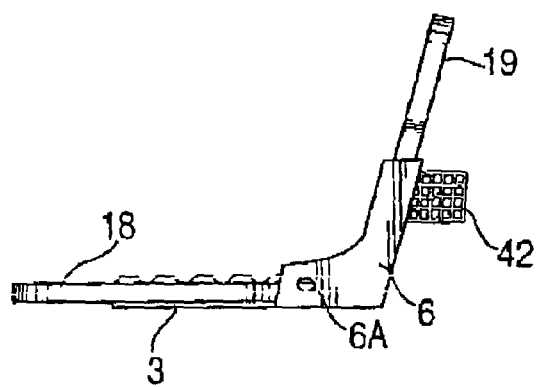
FIG. 9 is a side view of the locking apparatus of FIG. 8 used on a notebook computer showing the housing cage feature.

Compartment 42 is also shown in the side view of FIG. 9.

Figure 10:
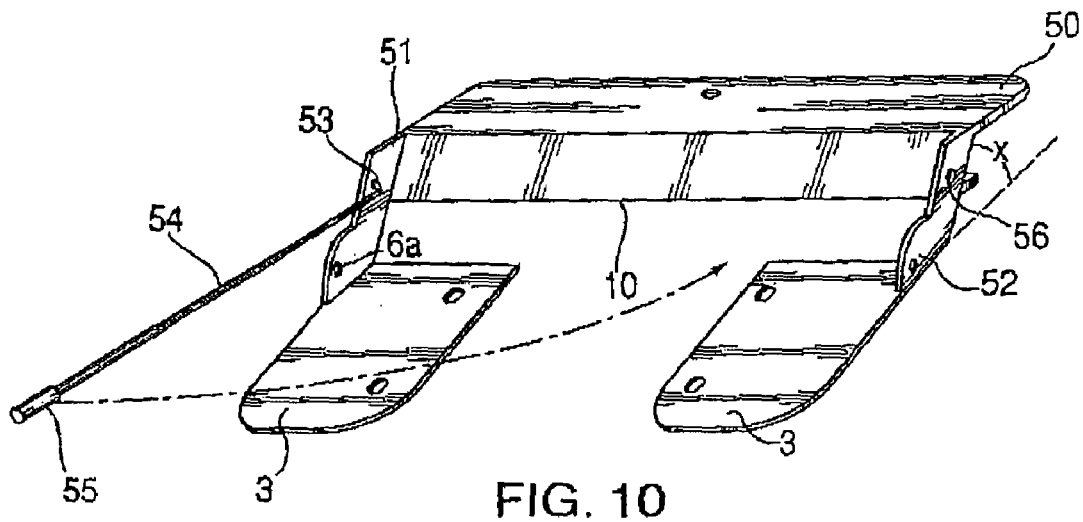
FIG. 10 is a perspective view of a further alternate swing arm embodiment using a swinging arm, such as a telescoping bar, to secure a typical notebook computer.

In a further alternate embodiment, shown in FIG. 10, a locking base using a telescoping rod 54 is shown. In this embodiment, there is no member such as locking collar 2 or transparent panel 30 that can be readily removed from the locking base when a computer is not secured to the base. This should reduce the incidence of vandalism or theft of the removable item which would render the base unusable. In FIG. 10, one end of bar 54 is attached to the left side panel member 51 of base 50 via a pivotable fastener, such as ball joint 53. After the notebook computer is inserted between sides 51 and 52, bar 54 is swung over the lower (hinge) portion of the notebook computer's screen, such as a liquid crystal display (LCD) screen and is elongated so as to insert lock plug 55 through locking hole 56 in right side 52. A lock (not shown), such as padlock 20, is then inserted through the hole in plug 55 thus locking computer to base.

Figure 11:
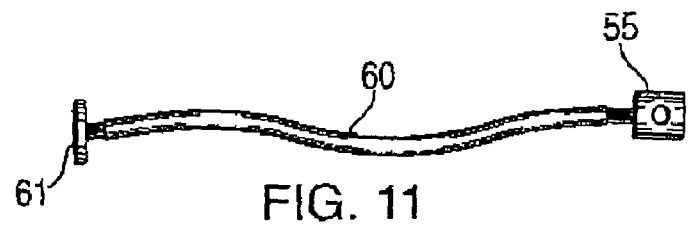
FIG. 11 is a top plan view of a clad steel cable used as a locking element for the further alternate swinging arm embodiment.
Figure 12:
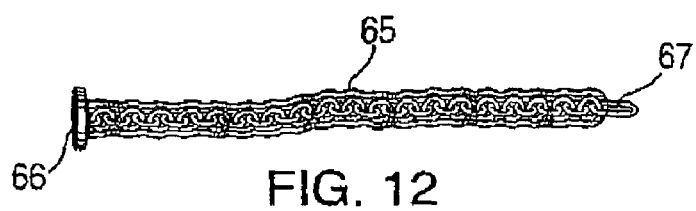
FIG. 12 is a top plan view of a chain inside a flexible tube as an alternate locking element in the embodiment of FIG. 10.

Alternate locking members include locking members such as vinyl clad steel cable 60 shown in FIG. 11, and the flexible tubing clad chain 65 shown in FIG. 12. These two devices do not require a ball joint attachment to left flange 51. Cable 60 can be simply inserted through a hole in flange 51 and then retaining washer 61 can be permanently attached as by spot welding. Lock plug 55, used as for telescoping rod, is attached to the distal end of cable 60. Chain 65 can be attached to flange 51 in a similar fashion by attaching washer 66 to its proximal end after threading through a hole. The distal end of chain 65 has an elongated link 67 with stop washer attached. The padlock is engaged through this link after it emerges through hole 56 in side 52.

Figure 13:
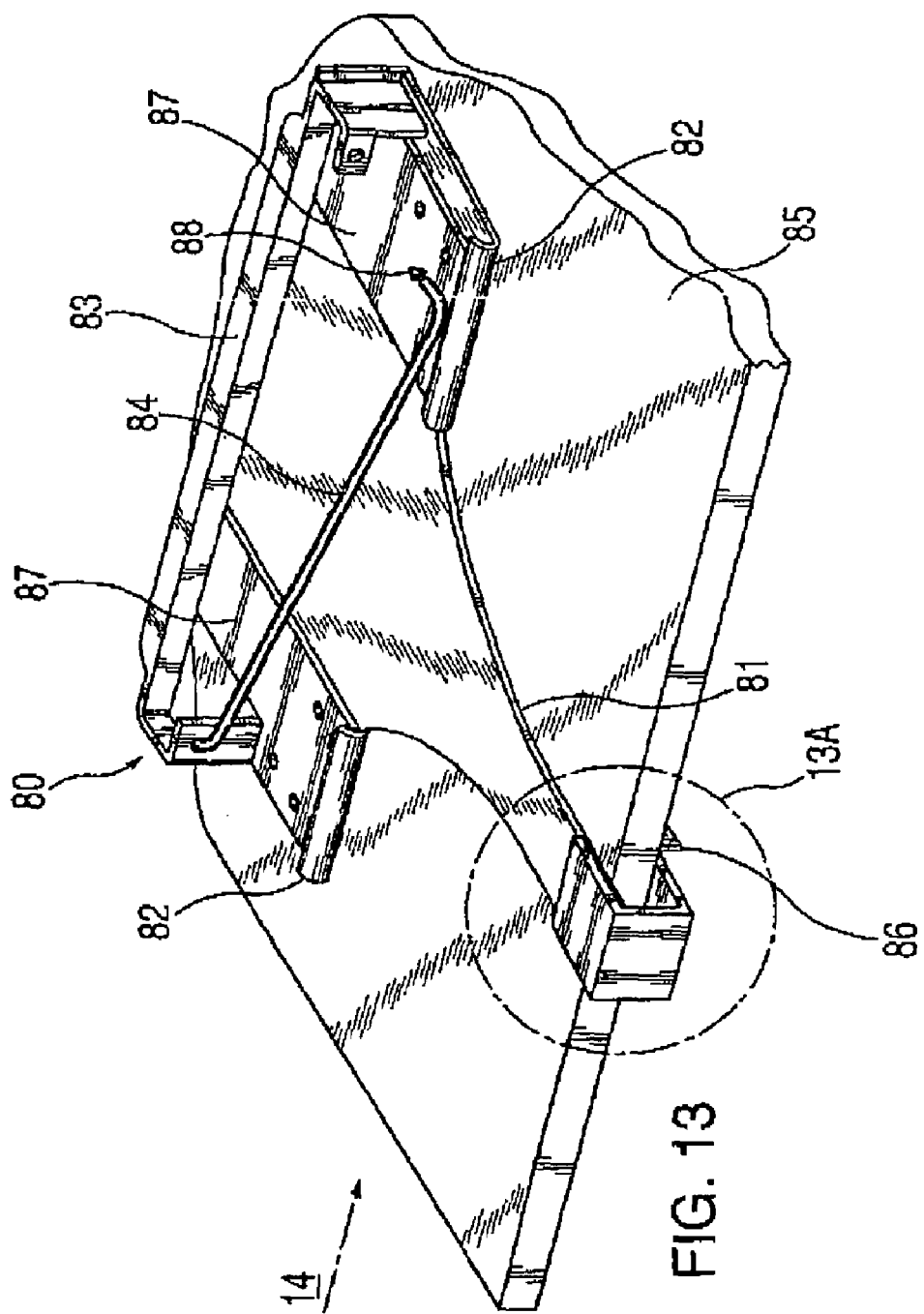
FIG. 13 is a perspective view of an alternate embodiment of a notebook computer lock using a separate over the table locking base and a computer lock using a captive swinging locking bar, which fits across lower portion of the display.

FIG. 13 shows an alternate embodiment using a separate locking base 81 used with a notebook computer lock 80 which slides in from the left so that one or more base pads 87 are retained by one or more brackets 82 on base 81.

Figure 13A:
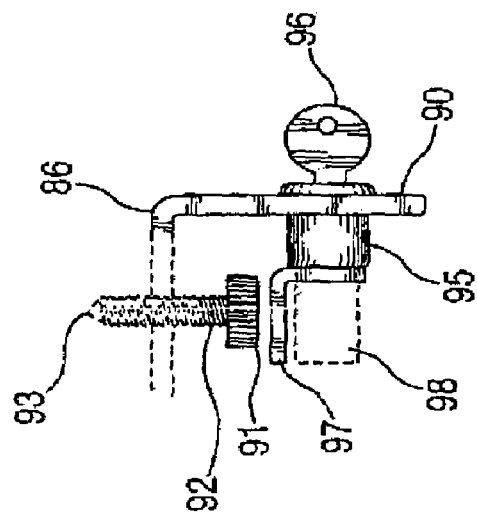
FIG. 13A is a front elevation of a clamp detail of the locking base shown in FIG. 13.
Figure 14:
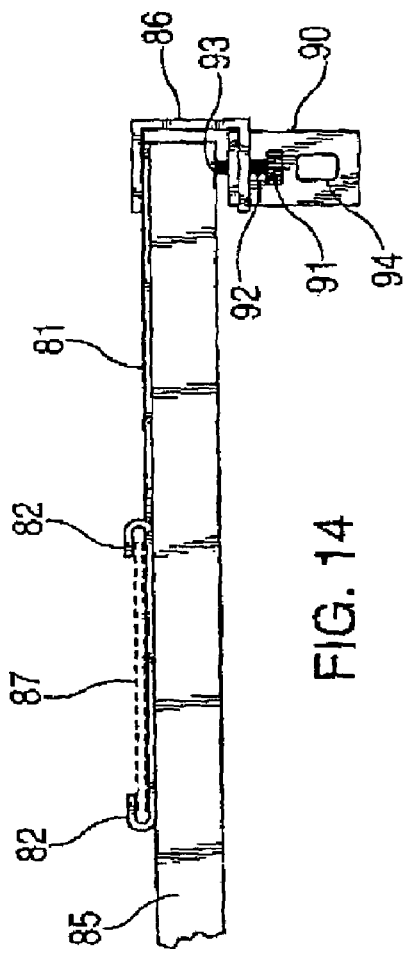
FIG. 14 is a side edge view of the locking base of FIG. 13, attached to a work surface.

A better view of this is the side edge view of FIG. 14. Clamp 86 slips over the edge of work surface 85. Locking bar 84 is captive in left bracket of computer lock 80, but it can swing out to permit access of computer display. The distal end 88 is grooved to accommodate a key lock to secure the computer as well as lock 80 to base 81. The long neck portion of base 81 from clamp 86 to brackets 82 positions the computer at a convenient distance from the front edge of table working surface 85. The detail of clamp 86 in FIG. 13A shows how screw 92 with optional security head 91 is screwed into the bottom surface of table working surface 85 via pointed end 93.

Figure 13B:
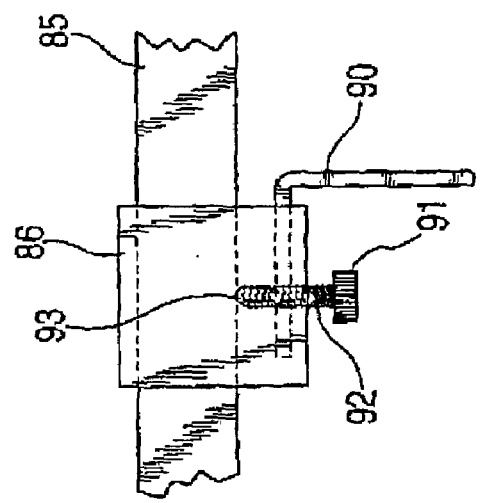
FIG. 13B is a clamp bracket side elevational view thereof, showing use of a key lock.

FIG. 13B shows how tang 97 prevents screw 91 from being loosened when lock 95 is locked via key 96. Lock 95 can be easily removed from hole 94 in lock bracket 90. When tang 97 is turned to position 98, screw head 91 is not obstructed so that it can be removed or tightened.

Figure 15:
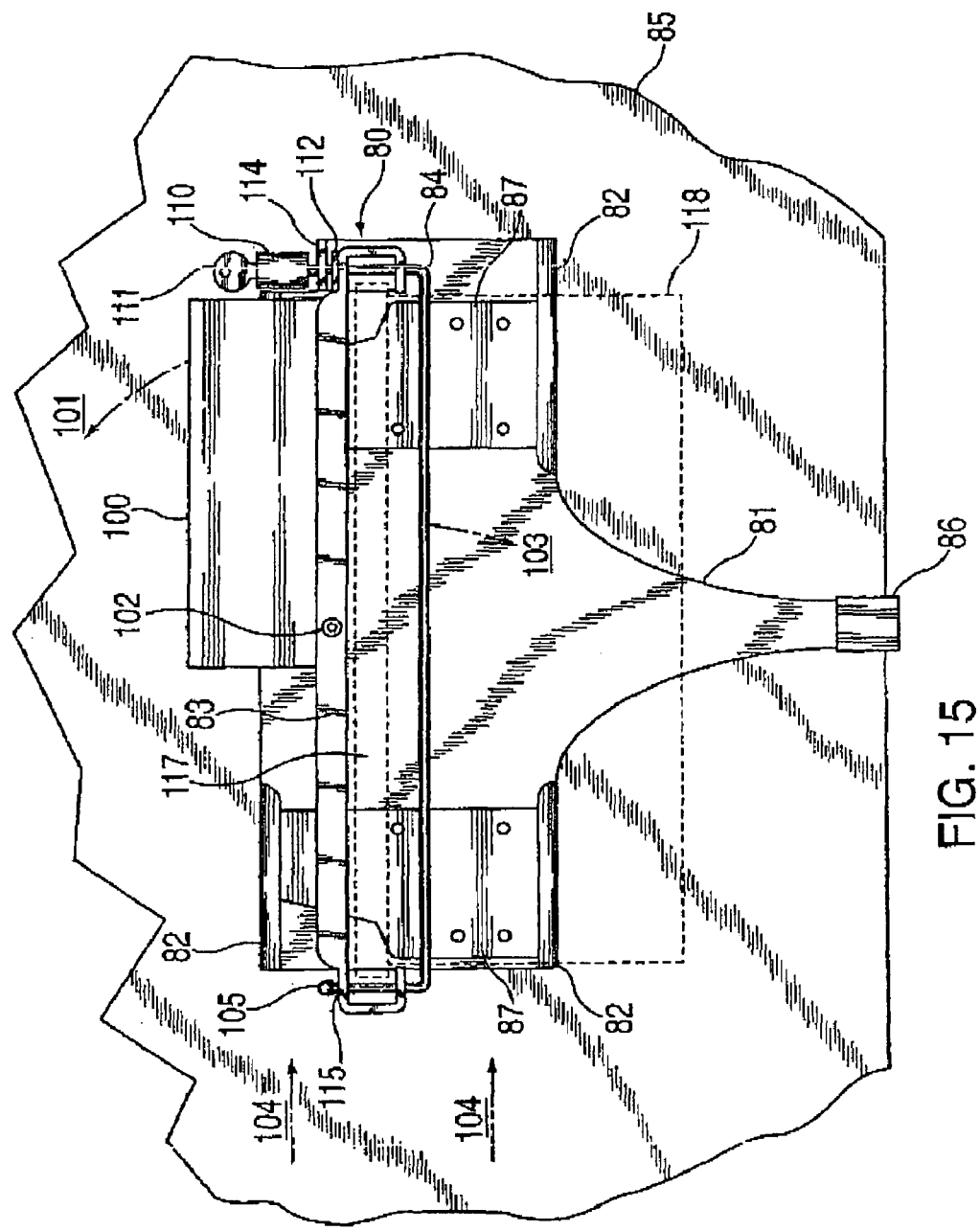
FIG. 15 is a top plan view of the computer lock of FIG. 13, secured within a locking base, also showing the position of the notebook computer with dashed lines.

FIG. 15 is a top plan view showing details of notebook computer lock 80 locked to base 81 with a computer display shown in dashed lines in position 117 and keyboard shown in dashed lines in position 118. Power supply box 100 can pivot open in the direction of arrow 101 on shaft 102 with a retaining cap; it is locked via tang 112. Notebook computer lock 80 is slid into a captive position within brackets 82 retaining the edges of base plates 87 in the direction of arrow 104. The left end of swinging locking bar 84 (which can swing out in the direction of arrow 103) is retained via retaining cap 105 within slotted hole 115 and an oversize hole on front of the left bracket. Key lock 110 grasps rod end 88 of swinging locking bar 84, which maintains the security of the assemblage via bracket tang 114, which is part of locking base 81. Key 111 can be used to remove the lock body from the end of swinging locking bar 84.

While FIG. 13-15 shows a separate over the table locking base 81 used with a notebook computer lock 80 which slides in from the left so that base pads 87 are retained by brackets 82 on base 81 of notebook computer lock 80, it is contemplated that a further alternate embodiment includes attaching notebook computer lock 80 directly to a work surface 85, such as a study desk, by providing fastener receptacles within base pads 87, wherein fasteners, such as screws or bolts fasten base 81 directly to an upper side of the work surface 85, without the use of over the table base 81.

Figure 16:
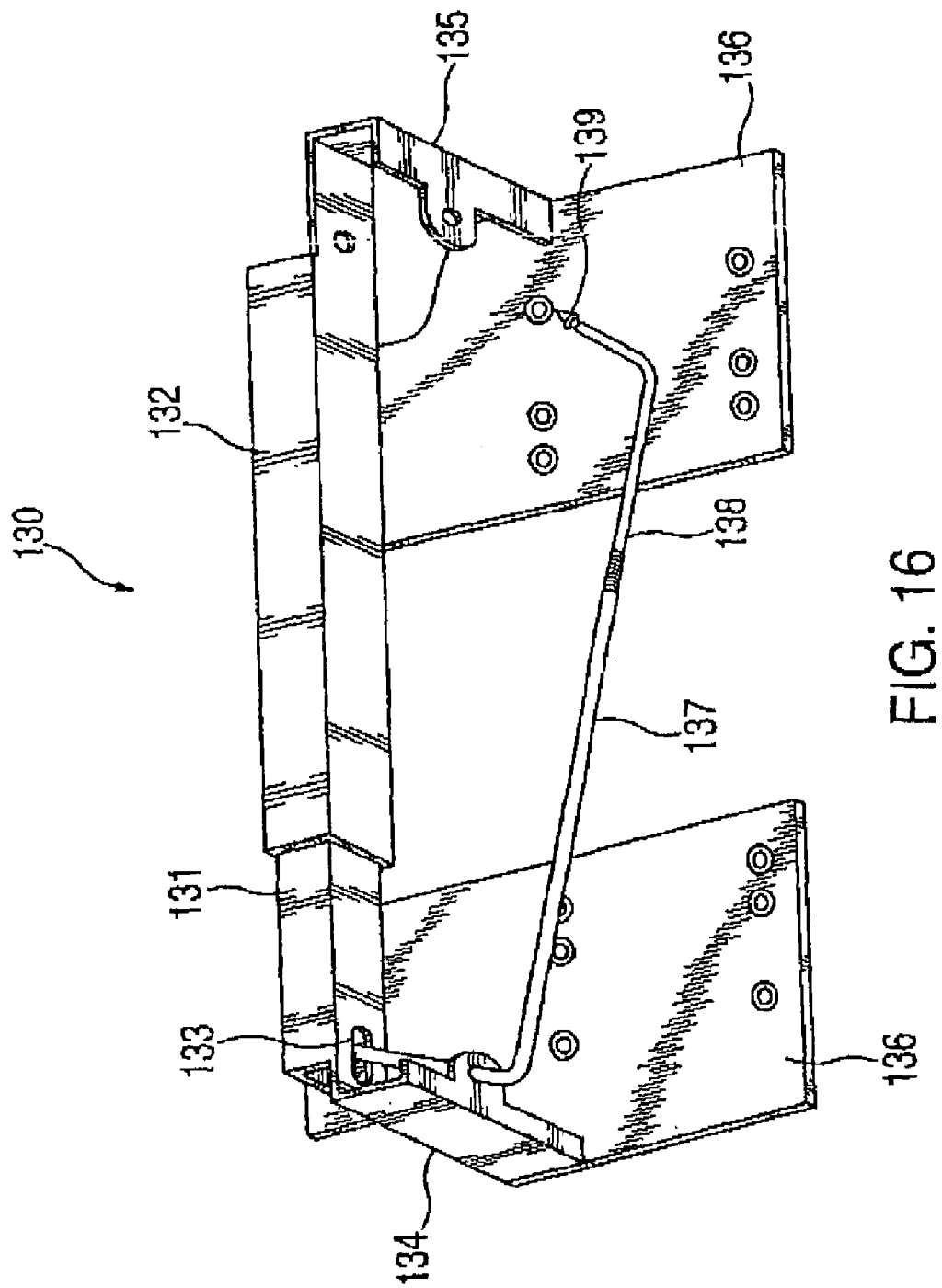
FIG. 16 is a perspective view of one embodiment for a width adjustable notebook computer lock.

FIG. 16 shows another embodiment of a notebook computer lock 130 with a telescoping width adjusting feature to accommodate computers of varying widths more securely. Base pads 136 are compatible with the use of locking base 81 of the previous embodiment to retain this continuous adjustment feature. Locking bar portions 137 and 138 are adjustable in size. For example, as in FIG. 17, incrementally spaced detents or pins and holes may be used to facilitate width adjustment. Alternatively, as in FIG. 16, locking bar 137 may be hollow and threaded with a coarse thread; it is captive within left bracket 134 and slotted back hole 133. Right section of locking bar 138 is screwed into portion 137 and can be quickly length adjusted by twisting it clockwise or counter-clockwise. Horizontal section 131 fits into section 132 in a telescoping fashion. After the notebook or laptop computer display is placed between the spread-apart brackets, the brackets are pushed against its sides and swinging locking bar portions 137 and 138 are adjusted accordingly to fit into holes in right bracket 135 for locking.

Figure 17:
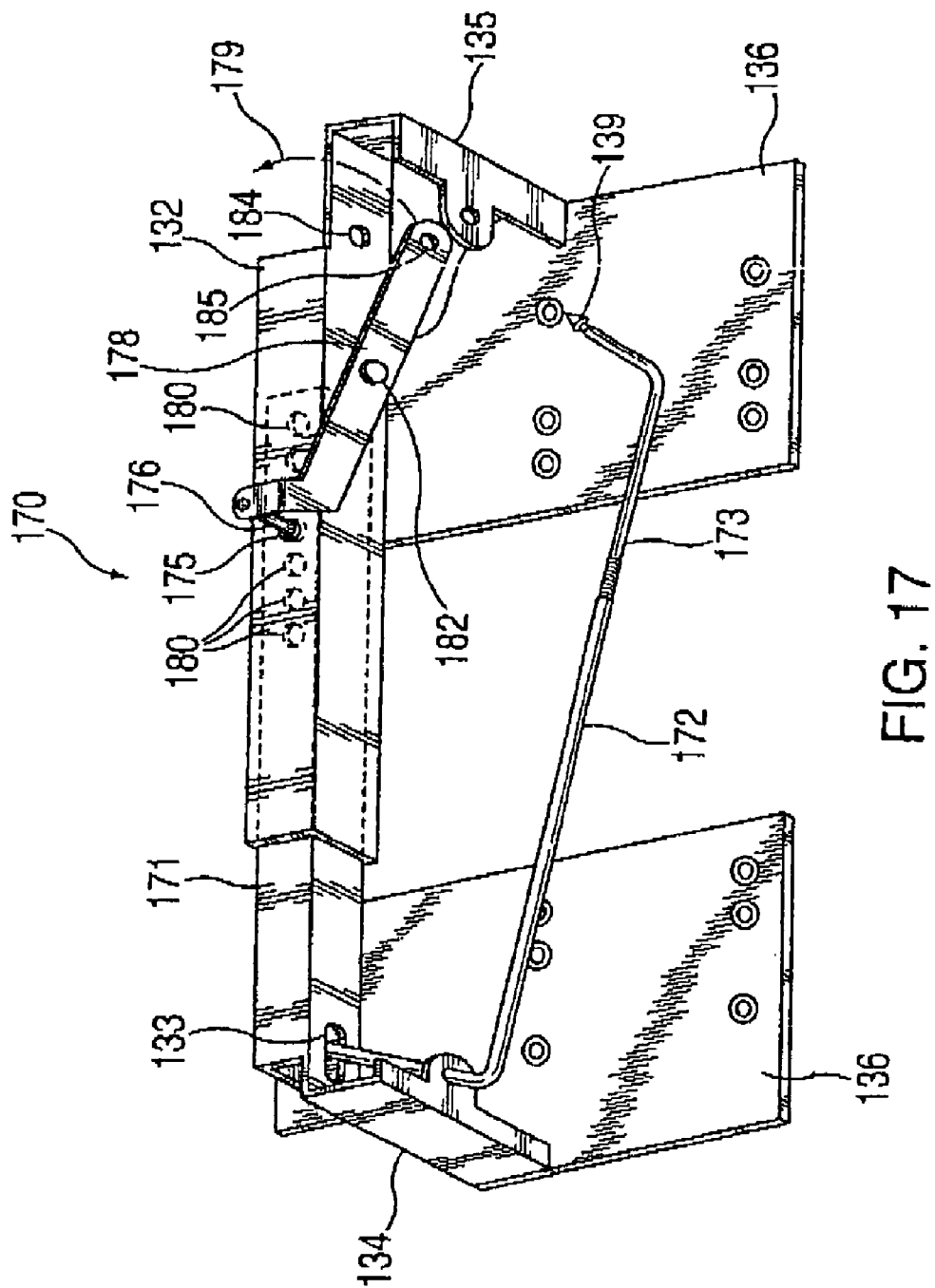
FIG. 17 is a perspective view of a further embodiment for a discrete width adjustable notebook computer lock.

FIG. 17 shows a different width adjustable computer lock 170 with a discrete locking mechanism including pivoted flange 178 with peg 176 at its distal end. Flange 178 is pivoted on pivot 182, such as a rivet, attached to outer telescoping member 132 of notebook computer lock 170. When swung in the direction of arrow 179, flange 178 will force peg 176 through hole 175 in telescoping section 132 and further into one of the holes 180 in inner telescoping member 171 when in positional registration. Flange 178 is locked in position when hole 185 is in positional registration with hole 184 and locking bar 173 end 139 is passed through both. The swinging locking bar includes hollow side section 172 and inner, preferably solid, side section 173, which is telescopic within outer hollow side section 172.

FIG. 18 shows another embodiment 150 of this invention wherein the locking base has been integrated with the notebook computer lock. Clamp 153 locks onto work surface 85 as described in a previous embodiment with a separate locking base 81 (see FIGS. 13-14). Upright brackets 151 and 152 with bar 83 between capture the notebook computer display which is then locked via swinging locking bar 84 and a key lock (not shown).

A related embodiment in FIG. 19 shows integrated base/computer lock 160 which has one or more pivot points 164 and 166 (on base part 167). Link 165 now pivots in relation to clamp section 163 such that the notebook computer lock 160 can be more conveniently positioned on work surface 85.

In FIG. 19, for example, clamp 163 is placed on the edge to the side of computer lock base 167 instead of directly in front of it as would be necessary in the embodiment of FIG. 18.

The preferred embodiment of this invention for consumer use is detailed in FIGS. 20-27.

Figure 20:
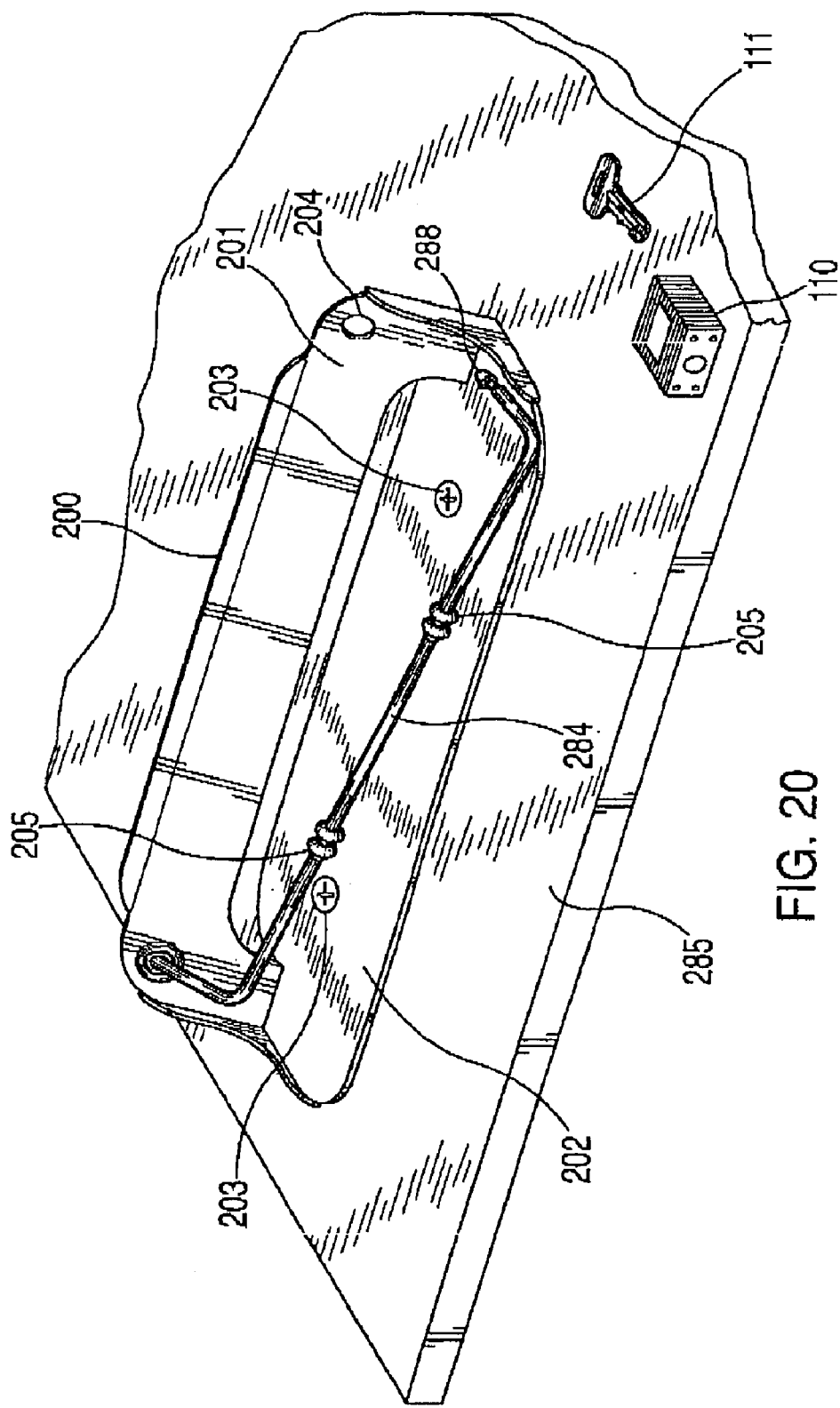
FIG. 20 is a perspective view of a preferred embodiment for a low profile notebook computer, shown attached by fasteners, such as screws, down to the work surface.

FIG. 20 shows a low profile locking base 200 with narrow base 202 and low rise back 201. It is screwed to work surface 85 via screws 203. Locking bar 84 with optional rubber or elastomer grommets 205 and machined end 88 is used to lock the display of a notebook or laptop computer (not shown) to locking base 200. End 88 is passed through hole 204 and locked with pin lock 110. Key 111 is used to unlock and remove the computer.

Figure 21:
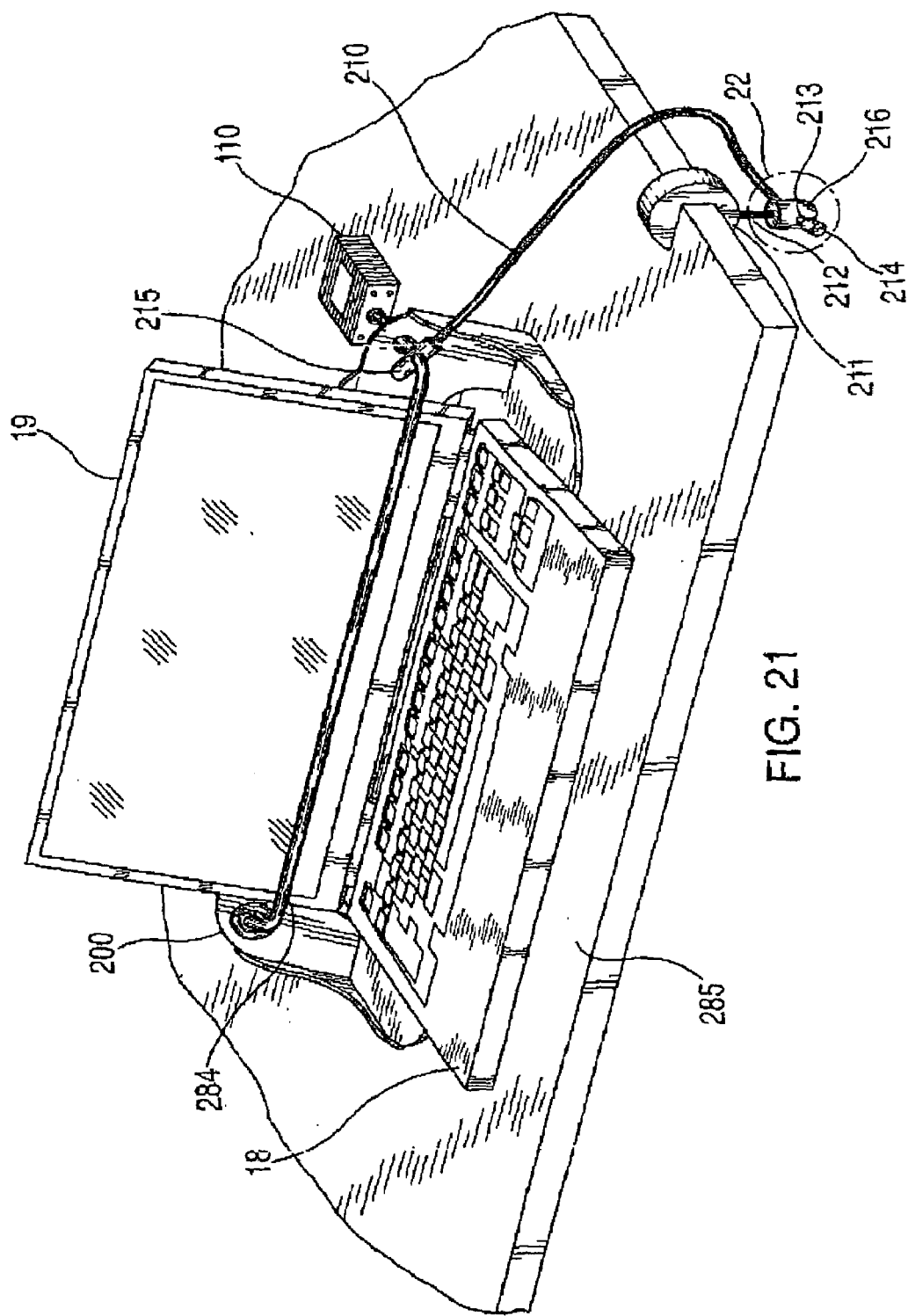
FIG. 21 is a perspective view of the locking base of FIG. 20 used as a portable device secured to the work surface via a cable and clamp.

The preferred method of use of this locking base is not to screw it down as shown in FIG. 20 but instead to create a portable locking kit by adding a clamp 211 and cable 210 as shown in FIG. 21.

Due to the low profile design with a narrow base, all components of the portable kit conveniently fit into a tubular carrying case (not shown).

FIG. 21 also shows Clamp 211 having a fastener, such as a screw subassembly, including screw 212 and cylinder 216 with transverse cable attachment hole 213. At the first end of cable 210 is a ferrule 215 with a transverse hole. This fits through hole 213. The cable is threaded through hole 213 after clamp 211 is secured using the appropriate tool to tighten screw 212. The distal end of cable 210 has ferrule 214 with enlarged end which does not fit through hole 213.

FIG. 22 shows the arrangement more clearly. It is noted that cylinder 216 has distal hole 220 which accommodates the screw head and also has a screw clearance hole 221 on its top surface. After cable 210 is threaded through hole 213, a tool cannot reach screw head 222 to loosen clamp 211 since access is denied through distal hole 220. After cable 210 is installed through cylinder 216, the end 88 of locking bar 84 is passed through the transverse hole in ferrule 215 prior to locking bar 84 to base 200.

In an alternate embodiment of the clamp screw subassembly no tool is required to tighten or loosen clamp 211.

An exploded view of subassembly 230 is shown in FIG. 23 with end cap 231 pushed down over clamp screw 233 and press fit into the end of knob 235. Optional pins 238 can be driven radially to insure positive attachment. Cap 231 has screw clearance hole 232 at its center. Screw 233 becomes captive as a subassembly with tall head 234 within knob 235 once cap 231 is attached. Offset transverse hole 237 in knob 235 goes through both walls and is sized for cable attachment.

FIG. 24 shows the underside of cap 231 revealing hexagonal recess 240 sized to engage bolt head 234.

FIG. 25 is a top view of subassembly 230. In the side crossection of FIG. 26, bolt head 234 is seated in recess 240 of cap 231. This is prior to the insertion of cable 210 through holes 237. Clamp 211 can be tightened in this depicted configuration by turning knob 235 since recess 240 acts as a socket wrench to bolt 233. It is noted also that the size of head 234 interferes with the placement of hole 237 thereby preventing insertion of cable 210 while head 234 is seated in recess 240.

If knob 235 is pushed up as shown in FIG. 27, cable 210 can now be easily inserted through holes 237 adjacent to screw 233 and spacing head 234 away from recess 240. In this configuration with cable 210 installed through knob 235, if turned, knob 235 will spin freely regardless of the up or down forces exerted. Clamp 211 can only be removed after cable 210 is removed and head 234 is re-seated in recess 240. In lieu of a non-standard screw 233 with tall head 234, a standard hex screw can be used with a nut screwed up against the head and adhesively bonded as a unit. A washer between the nut and the screw head would only enhance the operation creating a more positive barrier with cable 210.

In the foregoing description, certain terms and visual depictions are used to illustrate the preferred embodiment. However, no unnecessary limitations are to be construed by the terms used or illustrations depicted, beyond what is shown in the prior art, since the terms and illustrations are exemplary only, and are not meant to limit the scope of the present invention.

It is further known that other modifications may be made to the present invention, without departing the scope of the invention.

I claim:

1. A notebook computer locking assembly comprising:
a generally horizontal locking base for being secured to a working surface, said locking base receiving a keyboard portion of said notebook computer against a said generally horizontal base thereof; and a first generally upwardly extending rear wall to receive a screen portion of said notebook computer resting against said rear wall;
a movable locking member movable laterally in a generally horizontal axis from an open, unlocked position to a locking position against a lower portion of said screen portion; said movable locking member engaging said generally upwardly extending rear wall at a user operable lock associated with said rear wall; and,
said user operable lock locking said locking member in a locked position.

2. A notebook computer locking assembly comprising:
a locking base for being secured to a working surface, said locking base having a pair of side walls and a first rear wall to receive a keyboard portion of said notebook computer with a screen portion of said notebook computer in the open position resting parallel to said rear wall;
said rear wall having a rearwardly extending locking flange along a top edge of said rear wall;
a locking frame having a second rear wall having side walls and a locking bar joining said side walls, said locking frame adapted to slide over the screen portion of said notebook computer in the open position with said second rear wall between the screen portion and said first rear wall and said locking bar extending across a front surface of said screen portion;
said second rear wall having a rearwardly extending locking flange along a top edge of said second rear wall on top of and flush against said locking flange of said first rear wall;
the side walls of said locking base having tabs bent toward said computer, said locking bar falling behind said bent tabs when said locking frame is deployed on said notebook computer preventing removal of said notebook computer from said locking base; and
locking holes in both flanges aligned with each other to receive a padlock to lock said locking frame to said locking base.

3. The notebook computer locking assembly of claim 2 in which fasteners are employed to attach said locking base to said working surface, said fasteners being under the keyboard portion of said computer.

4. The notebook computer locking assembly of claim 3 in which said rear walls are at a good viewing angle for the computer screen.

5. The notebook computer locking assembly of claim 4 in which lower edges of said rear walls are raised a sufficient distance to allow access to connectors on a rear surface of said keyboard portion of said computer.

6. The notebook computer locking assembly of claim 5 having a cage attached to a rear of said first rear wall to house an auxiliary battery, charger or battery eliminator.

7. A notebook computer locking assembly comprising:
a locking base for being secured to a working surface, said locking base having a pair of side walls and a rear wall to receive a keyboard portion of said notebook computer with a screen portion of said notebook computer in the open position resting adjacent to said rear wall;
said rear wall having a rearwardly extending locking flange along a top edge of said rear wall;
a transparent locking frame having a surface adapted to rest against a front surface of said screen, a top wall adapted to rest against a top surface of the screen portion of said computer, a rear wall extending down from said top wall adjacent a rear surface of said screen portion of said computer, and a rearwardly extending flange from a bottom edge of said rear wall, said rearwardly extending flange adjacent said rearwardly extending locking flange of said locking base; and
locking holes in both flanges aligned with each other to receive a padlock lock said transparent locking frame to said locking base.

8. The notebook computer locking assembly of claim 7 having a cage attached to a rear of said rear wall to house an auxiliary battery charger or battery eliminator.

9. A notebook computer locking assembly comprising:
   a locking base for being secured to a working surface, said locking base having a pair of side walls and a rear wall to receive a keyboard portion of said notebook computer with a screen portion of said notebook computer in the open position resting parallel to said rear wall, said side walls extending past a front surface of said screen portion;
   a locking bar hinged at one end to one of said side walls in front of said screen portion;
   said locking bar pivoting in a generally horizontal axis laterally against a lower portion of said screen portion;
   an opposite end of said locking bar having a plug with an opening therethrough;
   an opening in the other of said side walls configured to align with the opening in said plug when said locking bar is rotated across a front surface of the screen portion with said plug adjacent the other of said side walls to accommodate a padlock to lock said computer into said locking base.

10. The notebook computer locking assembly as in claim 9 having a cage attached to a rear of said rear wall to house an auxiliary batter, charger or batter eliminator.

11. A notebook computer locking assembly comprising:
   a locking base, said looking base having a pair of side walls and a rear wall to receive a keyboard portion of said notebook computer with a screen portion of said notebook computer in the open position resting parallel to said rear wall, said side walls extending past a front surface of said screen portion;
   a locking bar hinged at one end to one of said side walls in front of said screen portion;
   said locking bar pivoting in a generally horizontal axis laterally against a lower portion of said screen portion;
   an opposite end of said locking bar having a plug engageable with a lock receptacle of a lock;
   an opening in the other of said side walls configured to align with an opening in said plug when said locking bar is rotated across a front surface of the screen portion with said plug adjacent the other of said side walls, said plug insertable within said locking receptacle of said lock to lock said computer to said locking base.

12. The notebook locking assembly as in claim 11 further comprising said locking base having at least one leg plate slidable into a receptacle portion of a locking base;
   said locking base having a distal end wrapping over an edge of a work surface upon which said notebook computer is used;
   said distal end further including a locking pin movable upward into a locking position against an underside of said work surface;
   said locking pin locked in place by a further lock preventing removal of said locking pin away from said underside of said working surface.

13. The notebook computer locking assembly as in claim 11 further comprising said locking base having at least one leg plate having fastener receptacles accommodating fasteners fastening said at least one leg plate to an upper side of a work surface upon which said notebook computer is used.

14. The notebook computer locking assembly as in claim 11 wherein said locking base and said locking bar are telescopically width adjustable.

15. The notebook computer locking assembly as in claim 11 having a cage attached to a rear of said rear wall to house an auxiliary batter, charger or battery eliminator.

16. The notebook computer locking assembly as in claim 11 further comprising:
   said locking bar being a width adjustable computer lock bar with a discrete locking mechanism including a pivoted flange with a peg at its distal end, said pivoted flange about an outer telescoping member, wherein when swung, said flange forces a peg through a hole in said telescoping member and further into one of respective holes in an inner telescoping member when in registration, said flange being locked in position when hole in said outer telescoping member is in registration with a corresponding hole in said inner telescoping member, said locking bar including an outer hollow portion and an inner solid portion which is telescopic within said outer hollow portion.

17. The notebook locking assembly as in claim 12 further comprising a locking base integral with said computer lock, said locking base having an over clamp locking lock locking said locking base onto said work surface.

18. The notebook locking assembly as in claim 15 wherein said base includes at least one pivot point, said base pivoting in relation to a clamp, said clamp being placed on an edge to a side of said computer lock base.

19. A notebook computer locking assembly comprising:
   a locking base, said locking base having a rear wall to receive a keyboard portion of said notebook computer with a screen portion of said notebook computer in the open position resting against said rear wall,
   a locking bar hinged at one end to a first side wall in said locking base in front of said screen portion;
   an opposite end of said locking bar having a plug engageable with a lock receptacle of a lock;
   an opening in an opposite sidewall in said locking base configured to align with the opening in said plug when said locking bar is rotated in a generally horizontai axis laterally across a front surface of a lower portion of the screen portion with said plug adjacent said opposite side wall of said locking base, said plug insertable within said locking receptacle of said lock to lock said computer to a locking base.

20. The notebook computer locking assembly as in claim 19 further comprising said locking base having a distal end wrapping over an edge of a work surface upon which said notebook computer is used;
   said distal end of said locking base further including a locking pin movable upward into a locking position against an underside of said work surface;
   said locking pin locked in place by a further lock preventing removal of said locking pin away form said underside of said working surface.

21. A notebook computer lock comprising:
   a low profile locking base, said locking base having a receptacle for receiving a distal end of a pivotable locking member pivotably attached at a proximal end thereof to said locking base;
   said pivotable locking member pivoting in a generally horizontal axis laterally against a lower portion of portion of a notebook computer;
   said locking base being fastenable to a notebook computer work surface in the vicinity of said notebook computer;
   a pin lock to secure a locking bar across a display portion of a notebook computer and into said locking base, thereby securing the notebook computer in a locked position within said lock.

22. The notebook computer lock as in claim 21 further comprising:
a cable and clamp attachable to a non-movable structure in the vicinity of the notebook computer.

23. The notebook computer lock as in claim 22 further comprising:
a clamp locking member extending through a clearance hole in a short container, said short container having a large axial hole at the distal end accommodating said locking member, a tightening tool compatible with said locking member being entered from said distal hole of said short container to tighten or loosen said clamp while also capturing said short container;
said cable having a small end ferrule with a transverse hole on one end and a ferrule with a larger end attached to a distal end of said cable;
a transverse hole being provided in a lower portion of said short container accepting said ferrule and said cable, but being sized to prevent access to a larger end of said distal ferrule;
said clamp being attached to the notebook computer work surface;
said cable being threaded through said transverse hole in said short container;
a distal end of a horizontally pivoting locking bar pivoting from a locking base supporting a notebook computer being passed through said cable ferrule with said transverse hole prior to locking said locking bar to said locking base;
said cable being threaded through said transverse hole in said short tube denying access to the said clamp locking member head;
wherein said cable must be removed before said clamp can be loosened.

24. The notebook computer locking base as in claim 22 wherein a hollow knob includes a captive clamp locking member emerging from a clearance hole in an end cap;
said clamp locking member having a head;
a recess with a configuration matching said locking member head being formed into an inside surface of said end cap such that a slight pull on the knob against a captive locking member head away from said clamp seats said locking member head into said recess with a slight turn;
wherein said end cap is a socket wrench used to either tighten or loosen said clamp;
wherein further an offset transverse hole is prevented from accepting said cable by said locking member head if said locking member head is seated in said wrench recess;
wherein further, pushing up on the end of the knob toward said clamp, clearance for said cable to enter through said transverse hole adjacent to said locking member and between said head and said end cap is formed,
said locking member head being spaced apart from the end cap socket wrench recess as long as the cable is present, device secured to the notebook computer work surface via a cable and clamp.

25. A notebook computer locking base comprising:
a low profile locking base having a narrow base and low rise back, said base being fastened to a notebook computer work surface;
a locking bar locking the computer display screen of a notebook or laptop computer to said locking base;
said locking bar pivoting laterally in a generally horizontal axis against a lower portion of a screen portion of the notebook computer;
an end of said locking bar being passed through a hole in said base and locked with a pin lock.

26. The notebook computer locking base as in claim 25 further comprising a clamp and a cable;
said clamp having a locking member subassembly including a locking member and a cylinder with a transverse cable attachment hole;
at a first end of said cable is a ferrule with a transverse hole;
said cable being threaded through said hole after said clamp is secured by a tightening tool to said locking member;
said distal end of said cable having a ferrule;
said cylinder having a distal hole accommodating said locking member head and said cylinder having a locking member clearance hole on a top surface thereof;
wherein after said cable is threaded through said hole, a tool cannot reach said locking member head to loosen said clamp since access is denied through said distal hole;
wherein further after said cable is installed through said cylinder, a distal end of said locking bar is passed through said transverse hole in said ferrule prior to locking said locking bar to said locking base.

27. The notebook computer locking base as in claim 25 further comprising a clamp locking member subassembly having an end cap pushed down over a clamp locking member and press fit into an end of a knob;
said cap having a locking member clearance hole at its center;
said locking member being captive within said knob;
said knob having an offset transverse hole protruding through both walls and being sized for cable attachment;
said clamp being tightened by turning said knob since said recess acts as a socket wrench to said locking member head;
wherein said locking member head interferes with the placement of said hole, thereby preventing insertion of said cable while said locking member head is seated in said recess;
wherein further if said knob is pushed up said cable is insertable through said holes adjacent to said locking member; thereby spacing said locking member head away from said recess;
wherein said cable being installed through said knob, and if turned, said knob spins freely regardless of the up or down forces exerted;
wherein further said clamp can only be removed after said cable is removed and said locking member head is re-seated in said recess.

28. The notebook computer as in claim 27 wherein said end cap has a recess accommodating said locking member head therein.

* * * * *